United States Patent
Imazu

(10) Patent No.: US 8,556,672 B2
(45) Date of Patent: Oct. 15, 2013

(54) METHOD OF PRODUCING LIGHT-EMITTING DEVICE AND LIGHT-EMITTING DEVICE

(75) Inventor: Kenji Imazu, Fujiyoshida (JP)

(73) Assignees: Citizen Electronics Co., Ltd., Yamanashi-Ken (JP); Citizen Holdings Co., Ltd., Tokyo (JP)

( * ) Notice: Subject to any disclaimer, the term of this patent is extended or adjusted under 35 U.S.C. 154(b) by 0 days.

(21) Appl. No.: 13/576,130

(22) PCT Filed: Jan. 28, 2011

(86) PCT No.: PCT/JP2011/051761
§ 371 (c)(1),
(2), (4) Date: Jul. 30, 2012

(87) PCT Pub. No.: WO2011/093454
PCT Pub. Date: Aug. 4, 2011

(65) Prior Publication Data
US 2012/0302124 A1    Nov. 29, 2012

(30) Foreign Application Priority Data

Jan. 29, 2010 (JP) ................. 2010-019073
Sep. 24, 2010 (JP) ................. 2010-214487

(51) Int. Cl.
*H01L 33/56* (2010.01)
*H05B 33/10* (2006.01)

(52) U.S. Cl.
USPC ......... 445/58; 313/512; 438/28; 257/E33.059

(58) Field of Classification Search
CPC ......... H05B 33/10; H01L 33/52; H01L 33/62
USPC ............. 445/58; 257/E33.064, E33.056, 757; 438/455–457, 26
See application file for complete search history.

(56) References Cited

U.S. PATENT DOCUMENTS

| 2004/0245530 A1 | 12/2004 | Kameyama et al. |
| 2007/0034995 A1 | 2/2007 | Kameyama et al. |
| 2010/0140640 A1 | 6/2010 | Shimokawa et al. |

FOREIGN PATENT DOCUMENTS

| JP | 2002064112 A | 2/2002 |
| JP | 2003023183 A | 1/2003 |
| JP | 2004363279 A | 12/2004 |

(Continued)

*Primary Examiner* — Tracie Y Green
(74) *Attorney, Agent, or Firm* — Browdy and Neimark, PLLC

(57) ABSTRACT

It is an object to produce a thin light-emitting device in an extremely simple method that does not include a substrate on which a light-emitting element is to be mounted.
A method of producing a light-emitting device, including: preparing a plurality of light-emitting elements each including element electrodes in a pair; arranging the plurality of light-emitting elements in a sealing member to expose at least one surface of each of the element electrodes in a pair provided to each of the light-emitting elements; forming external connection electrodes in a plurality of pairs on the sealing member, the external connection electrodes in each pair being electrically connected to the element electrodes in a pair provided to each of the light-emitting elements; and obtaining a plurality of light-emitting devices by dividing the sealing member with the plurality of light-emitting elements, the light-emitting devices each including a light-emitting element having element electrodes in a pair, a sealing member sealing the light-emitting element while at least one surface of each of the element electrodes in a pair is exposed, and external connection electrodes in a pair provided on the sealing member and electrically connected to the element electrodes in a pair.

8 Claims, 24 Drawing Sheets

(56) References Cited

FOREIGN PATENT DOCUMENTS

| | | |
|---|---|---|
| JP | 2004363380 A | 12/2004 |
| JP | 2005026401 A | 1/2005 |
| JP | 2006173605 A | 6/2006 |
| JP | 2006245626 A | 9/2006 |
| JP | 2007059492 A | 3/2007 |
| JP | 2007103978 A | 4/2007 |
| JP | 2008263082 A | 10/2008 |
| JP | 2009088190 A | 4/2009 |
| JP | 2010135693 A | 6/2010 |

METHOD OF PRODUCING LIGHT-EMITTING DEVICE AND LIGHT-EMITTING DEVICE

TECHNICAL FIELD

The present invention relates to a method of producing a light-emitting device including a light-emitting diode element and the light-emitting device.

BACKGROUND ART

A light-emitting diode element (hereinafter called light-emitting element briefly) has a compact size, provides favorable light-emitting efficiency and vivid color, of emission and has long operating life and excellent driving characteristics and the like. Accordingly, in recent years, it has been widely used as a light source for backlight of a color display device and for illumination purposes, for example. Thus, in embodiments, a light-emitting device including a light-emitting element will be described as the light-emitting device of the present invention.

A light-emitting device for emitting white light or a light-emitting device for emitting colored light has been proposed in recent years, and in this device, a light-emitting element mounted on a substrate is covered with a sealing member that may be a transparent resin, transparent glass, a phosphor resin or the like on. According to a known method, a light-emitting device of this structure is put into mass production by mounting a plurality of light-emitting elements collectively on a collective substrate (see Patent Literatures 1 and 2, for example).

FIG. 41 shows a conventional light-emitting device including a light-emitting element described in Patent Literature 1. This light-emitting device 100 includes: upper surface electrodes 102a in a pair formed on the upper surface of a resin substrate 102, the upper surface electrodes 102a including a first upper surface electrode 102a on which a light-emitting element 103 is directly mounted, and a second upper surface electrode 102a electrically connected to the light-emitting element 103 via a wire 104. The light-emitting device 100 further includes lower surface electrodes 102b for output formed on the lower surface of the resin substrate 102. The upper surface electrodes 102a in a pair and the lower surface electrodes 102b in a pair being external connection electrodes are electrically connected to each other via through hole electrodes 102c in a pair. The light-emitting element 103 is sealed with a transparent resin 105 on the substrate. A reflection member 106 intended to enhance light-emitting efficiency is provided on portions of the upper surface electrodes 102a in a pair except portions thereof required for bonding the light-emitting element with a wire.

FIG. 42 shows a conventional light-emitting device including a light-emitting element described in Patent Literature 2. This light-emitting device 200 includes upper surface electrodes 202a in a pair formed on the upper surface of a ceramic substrate 202 and electrically connected to a light-emitting element by directly mounting the light-emitting element on the ceramic substrate, and lower surface electrodes 202b in a pair for output formed on the lower surface of the ceramic substrate 202. The upper surface electrodes 202a in a pair and the lower surface electrodes 202b in a pair are electrically connected to each other via through hole electrodes 202c in a pair. The light-emitting element 203 is placed by flip-chip mounting on or above the upper surface electrodes 202a on the upper surface of the ceramic substrate 202 via bonding electrodes 203a or bumps in a pair formed on the lower surface of the light-emitting element 203. The light-emitting element 203 is sealed with low-melting point glass 205.

In the aforementioned light-emitting device 100 or 200 including a light-emitting element described in Patent Literature 1 or 2, a substrate with electrodes such as the resin substrate 102 or the ceramic substrate 202 is used to mount the light-emitting element on the substrate, and a resin to seal the light-emitting element is provided on the substrate to seal the light-emitting element. Accordingly, this substrate becomes an obstacle to reduce thickness of the light-emitting device 100 or 200 and a cause for deterioration of heat dissipation properties. Further, this substrate increases the number of components, and it also becomes a cause for increase in cost.

A light-emitting device which is prepared by eliminating a substrate in the end has been conventionally suggested to avoid the aforementioned problems (Patent Literature 3).

As shown in FIG. 43, this light-emitting device 300 includes electrodes 303a and 303c in a pair electrically connected to the light-emitting element 304, and an electrode 303b on which the light-emitting element 304 is to be mounted, with these electrodes being formed on the upper surface of a substrate 302 made of metal, plastic, silicone or the like. The light-emitting element 304 is fixed to the electrode 303b from above via an adhesive agent, and is connected via wires 305a and 305b to the element electrodes in a pair of the light-emitting element 304. Then, the light-emitting element 304 is sealed with a sealing member 306, and thereafter, the substrate 302 is removed by mechanical or chemical process. Thus, the electrodes 303a, 303b and 303c are finally exposed at one surface of the sealing member 306 to form electrodes of the light-emitting device 300.

The aforementioned conventional light-emitting device 300 is allowed to be reduced in thickness as a whole as the substrate 302 is removed at the end. Meanwhile, only the substrate 302 should be stripped while the plurality of electrodes 303a, 303b and 303c having been fixed tightly to the substrate 302 remain fixedly attached to the sealing member 306. This stripping is performed by mechanical or chemical process, making removal of the substrate 302 difficult work and lowering efficiency in this work. An additional problem also occurs in that it is hard to maintain the quality of the light-emitting device 300 at a constant level from which the substrate 302 has been stripped.

CITATION LIST

Patent Literature

[Patent Literature 1] Japanese Patent Application Laid-Open No. 2003-23183
[Patent Literature 2] Japanese Patent Application Laid-Open No. 2007-103978
[Patent Literature 3] Japanese Patent Application Laid-Open No. 2006-173605

SUMMARY OF INVENTION

Technical Problem

Thus, a problem to be solved by the invention is to produce a thin light-emitting device not using a substrate on which a light-emitting element is to be mounted by an extremely simple method.

Solution to Problems

In order to solve the aforementioned problem, one example of a method of producing a light-emitting device of the invention includes: preparing a detachable adhesive sheet; preparing a plurality of light-emitting elements each including element electrodes in a pair; arranging the plurality of light-emitting elements with the element electrodes in a pair of each of the light-emitting elements in contact with the adhesive sheet and buried in an adhesive layer of the adhesive sheet; providing a sealing member on the adhesive sheet at a side on which the plurality of light-emitting elements are arranged and sealing the plurality of light-emitting elements with the sealing member; and stripping the adhesive sheet from the element electrodes in contact with the adhesive sheet to expose the element electrodes of the plurality of light-emitting elements.

Another example of the method of producing a light-emitting device of the invention includes: preparing a plurality of light-emitting elements each including element electrodes in a pair; arranging the plurality of light-emitting elements in a sealing member with at least one surface of each of the element electrodes in a pair exposed; when the plurality of light-emitting elements are arranged, providing a reflection frame including a plurality of rectangular grids each of which surrounds each of the light-emitting elements, and providing a sealing member and sealing each of the light-emitting elements in each rectangular grid of the reflection frame that including the plurality of rectangular grids; forming external connection electrodes in a plurality of pairs on the sealing member, the external connection electrodes in each pair being electrically connected to the element electrodes in a pair provided to each of the light-emitting elements; when the sealing member sealing the plurality of light-emitting elements is divided, dividing the sealing member by cutting along the reflection frame to obtain a plurality of light-emitting devices each including a light-emitting element with element electrodes in a pair, a sealing member sealing the light-emitting element while at least one surface of each of the element electrodes in a pair is exposed, and external connection electrodes in a pair provided on the sealing member and electrically connected to the element electrodes in a pair.

Still another example of the method of producing a light-emitting device of the invention includes: preparing a transparent base; forming a phosphor layer on the transparent base; preparing a plurality of light-emitting elements each including element electrodes in a pair; arranging the plurality of light-emitting elements with opposite surfaces of the light-emitting elements opposite to surfaces of the light-emitting element on which the element electrodes are provided in contact with the phosphor layer from above; sealing the plurality of light-emitting elements each including the element electrodes in a pair with a sealing member; exposing at least one surface of each of the element electrodes in a pair of each of the plurality of sealed light-emitting elements from the sealing member by grinding the sealing member; and forming external connection electrodes in a plurality of pairs on the sealing member, the external connection electrodes in each pair being electrically connected to the element electrodes in a pair of each of the plurality of light-emitting elements.

Still further another example of the method of producing a light-emitting device of the invention includes: preparing a plurality of light-emitting elements each including element electrodes in a pair; arranging the plurality of light-emitting elements with the element electrodes in a pair of each of the plurality of light-emitting elements exposed from a sealing member; before a base electrode film is formed on the element electrodes of each of the plurality of light-emitting elements that are sealed with the sealing member, forming a protection film at a position corresponding to a position where the base electrode film is to be provided to the sealing member and on portions of the element electrodes except surfaces of the element electrodes exposed from the sealing member; forming the base electrode film on the element electrodes of each of the plurality of light-emitting elements; forming a resist mask on the base electrode film at a position where the base electrode film is divided into portions corresponding to a P electrode and an N electrode that are the element electrodes in a pair; forming metal plating for external connection electrode on the base electrode film at a position where the resist mask is not formed; removing the resist mask; and forming external connection electrodes in a plurality of pairs by etching the base electrode film at a position where the resist mark has been removed by using the metal plating for external connection electrode as a mask, the external connection electrodes in each pair being electrically divided into a P electrode and an N electrode and formed at positions where the external connection electrodes are electrically connected to the element electrodes in a pair of each of the plurality of light-emitting elements.

Advantageous Effects of Invention

According to the method of producing a light-emitting device of the present invention, the adhesive sheet is stripped from the sealing member to expose the element electrodes in a pair of the light-emitting element from one surface of the sealing member. Accordingly, the external connection electrodes in a pair configured to be electrically connected to the element electrodes can be formed on this surface of the sealing member. This made it possible to produce a light-emitting device quite easily that does not use a substrate on which a light-emitting element is to be mounted and external connection electrodes are to be formed.

DESCRIPTION OF EMBODIMENTS

Embodiments of the present invention are described below based on the accompanying drawings.
(First Embodiment)

Figure 1:
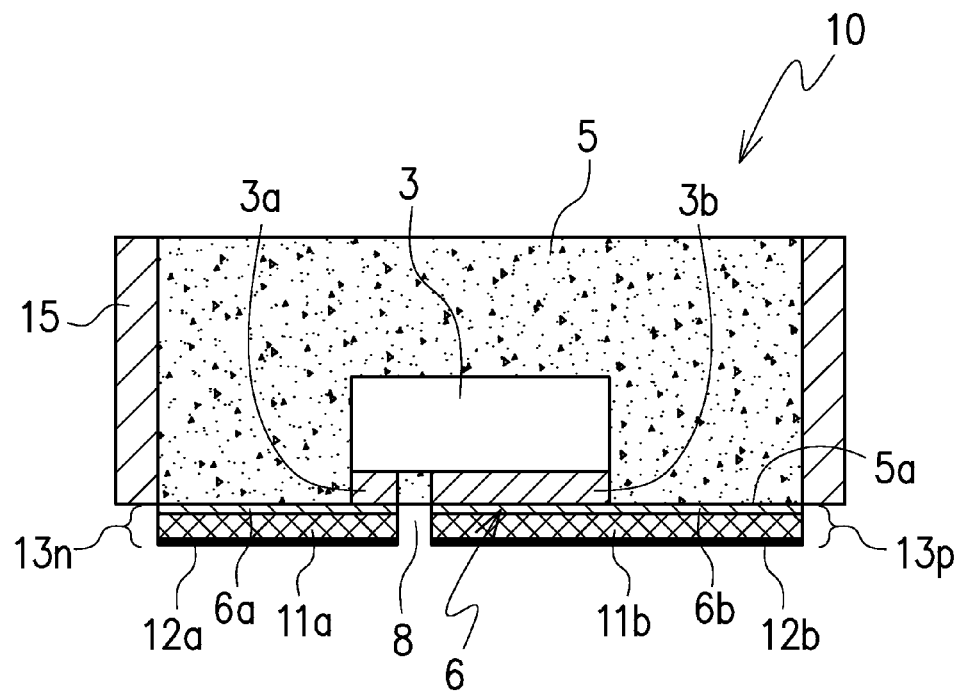
FIG. 1 is a cross-sectional view of a light-emitting device in a first embodiment of the invention.
Figure 2:
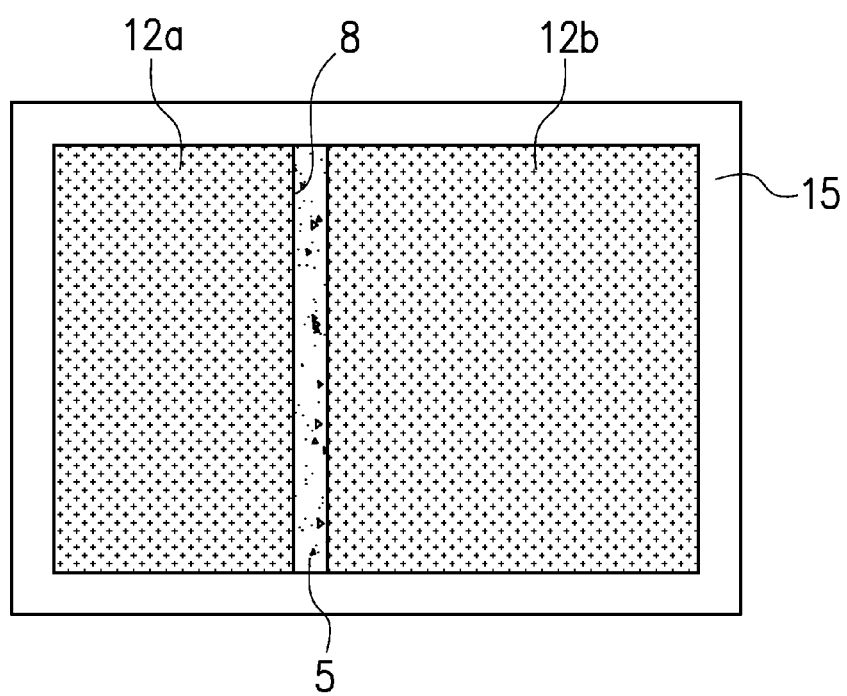
FIG. 2 is a plan view of the light-emitting device shown in FIG. 1 as viewed from the lower surface thereof.
Figure 3:
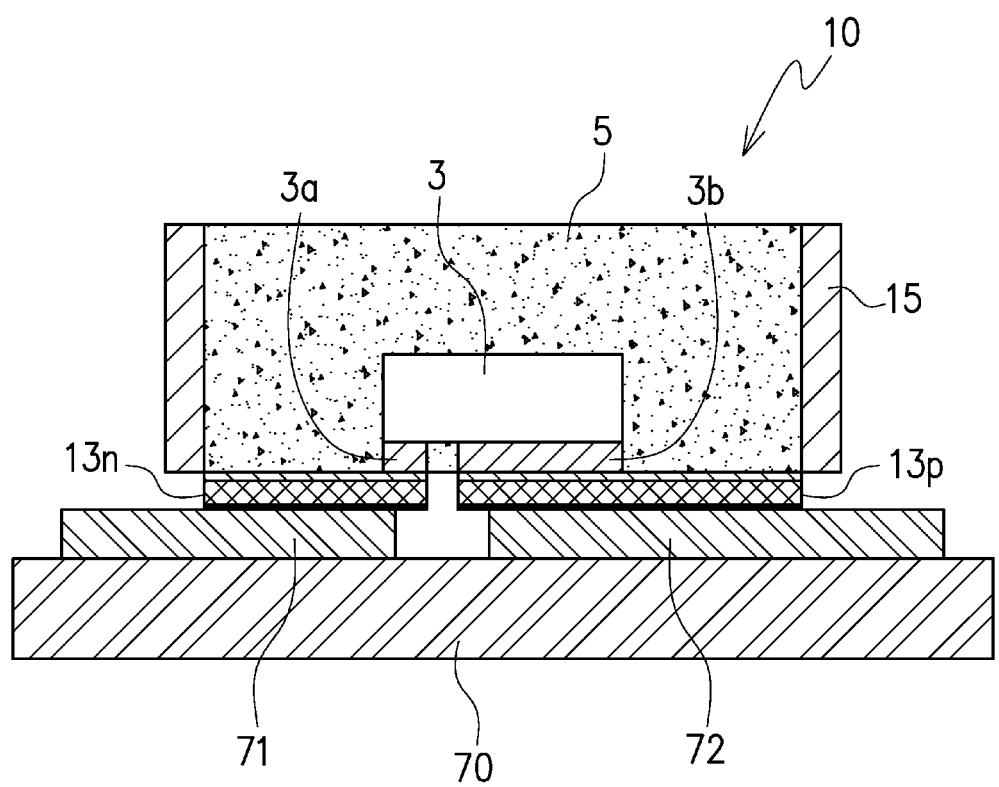
FIG. 3 is a cross-sectional view showing a condition where the light-emitting device shown in FIG. 1 is mounted on an external substrate.

FIGS. 1 to 3 show a light-emitting device produced by a production method according to a first embodiment of the invention. FIGS. 4 to 25 show steps of the production method according to the first embodiment.

A light-emitting device 10 shown in FIGS. 1 and 2 includes a light-emitting diode element (hereinafter called light-emitting element) 3 including an N electrode 3a and a P electrode 3b being element electrodes in a pair, a transparent sealing resin 5 or a light-transmitting sealing resin 5 in which fluorescent particles are mixed (hereinafter called sealing member) sealing the light-emitting element 3 while a lower surface being at least one surface of each of the element electrodes in a pair of the light-emitting element 3 is exposed, and external connection electrodes in a pair each formed on at least one surface of one of the element electrodes in a pair exposed from the sealing member 5, the external connection electrodes being electrically connected to the N electrode 3a and the P electrode 3b being the element electrodes in a pair of the light-emitting element 3. A reflection frame 15 is provided to the outer peripheral side surface of the sealing member 5, and the reflection frame 15 surrounds the light-emitting element 3. The upper and side surfaces of the light-emitting element 3 are sealed with the sealing member 5, and the sealing member 5 has the shape of a rectangular parallelepiped. The reflection frame 15 provided to the peripheral side surface of the sealing member 5 has a quadrangular frame shape. The sealing member 5 gets into a gap between the N electrode 3a and the P electrode 3b being the element electrodes in a pair provided on the lower surface of the light-emitting element 3. A lower surface 5a of the sealing member 5 is flush with the lower surfaces of the N electrode 3a and the P electrode 3b being the element electrodes in a pair of the light-emitting element 3. A base electrode film 6 described later is formed on the lower surface 5a of the sealing member 5 and the lower surfaces of the N electrode 3a and the P electrode 3b being the element electrodes in a pair of the light-emitting element 3. The base electrode film 6 functions both as a base electrode and a reflection film, and is desirably a film made of metal including excellent conductive property and reflectivity such as silver (Ag). The base electrode film 6 has a cutting portion 8 that divides the base electrode film 6 into an N electrode base film 6a and a P electrode base film 6b such that the N and P electrode base films 6a and 6b are electrically connected to the element electrodes 3a and 3b in a pair of the light-emitting element 3.

A nickel (Ni) layer 11a and a gold (Au) layer 12a are formed by plating in this order over the entire N electrode base film 6a, thereby forming an N external connection electrode 13n of a three layer structure. Likewise, a nickel (Ni) layer 11b is formed by plating on the entire lower surface of the P electrode base film 6b, and subsequently, a gold (Au) layer 12b is formed by plating on the entire lower surface of the nickel layer 11b, thereby forming a P external connection electrode 13p of a three layer structure. As a result, external connection electrodes in a pair are formed, and are electrically connected to the element electrodes in a pair of the light-emitting element 3. It is preferable that the reflection frame 15 in the form of a quadrangular grid provided to the peripheral side surface of the sealing member 5 be made of a white resin including high reflectivity.

The light emitting operation of the light-emitting device 10 will next be described. As shown in FIG. 3, the N external connection electrode 13n and the P external connection electrode 13p being the external connection electrodes in a pair of the light-emitting device 10 are soldered to interconnection electrodes 71 and 72 of an external substrate 70 on which the light-emitting device 10 is to be mounted, and thus, the light-emitting device 10 is electrically connected to the interconnection electrodes 71 and 72 of the external substrate 70 to be mounted on the external substrate 70. Predetermined power is supplied to between the N electrode 3a and the P electrode 3b being the element electrodes of the light-emitting element 3 through the interconnection electrodes 71 and 72 of the external substrate 70 and the external connection electrodes of the light-emitting device 10, thereby causing the light-emitting element 3 to emit light.

The light-emitting device 10 does not include a substrate on which the light-emitting element 3 is mounted. Accordingly, the light-emitting device 10 can be reduced in thickness while it is mounted on the external substrate 70. Not providing a substrate on which the light-emitting element 3 is to be mounted also makes it possible to cause heat generated in the light-emitting element 3 to escape directly to the interconnection electrodes 71 and 72 of the external substrate 70 through the N external connection electrode 13n and the P external connection electrode 13p. This achieves considerably high heat dissipation effect. Further, the N external connection electrode 13n and the P external connection electrode 13p are formed on the entire lower surface 5a of the sealing member 5, and thus, the light-emitting device 10 can be electrically connected to the interconnection electrodes 71 and 72 of the external substrate 70 in a wide contact area.

Figure 4:
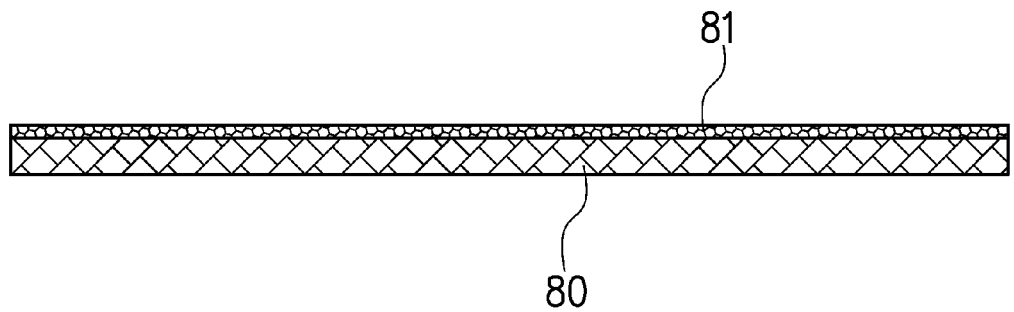
FIG. 4 is a cross-sectional view showing a method of producing the light-emitting device shown in FIG. 1 with a collective substrate, and showing a condition where a detachable adhesive sheet on which a plurality of the light-emitting devices is to be mounted adheres to a large-sized jig plate.
Figure 5:
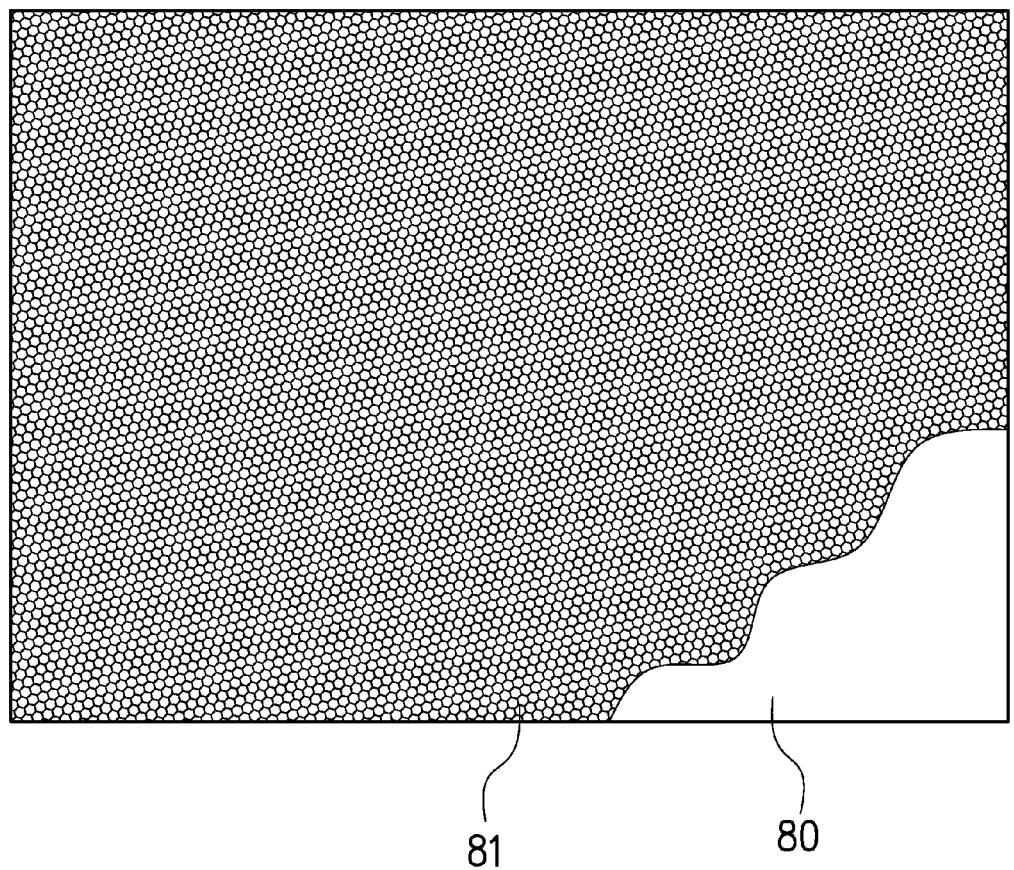
FIG. 5 is a plan view of the jig plate of FIG. 4 as viewed from above.

A method of producing the light-emitting device 10 will next be described based on FIGS. 4 to 25. Steps of the production method described here use a jig plate. FIGS. 4 and 5 show a large-sized jig plate 80 on which a plurality of light-emitting devices 10 is to be mounted, and a detachable adhesive sheet 81 adhering to the upper surface of the jig plate 80. The adhesive sheet 81 adheres to the substantially entire surface of the jig plate 80.

Figure 6:
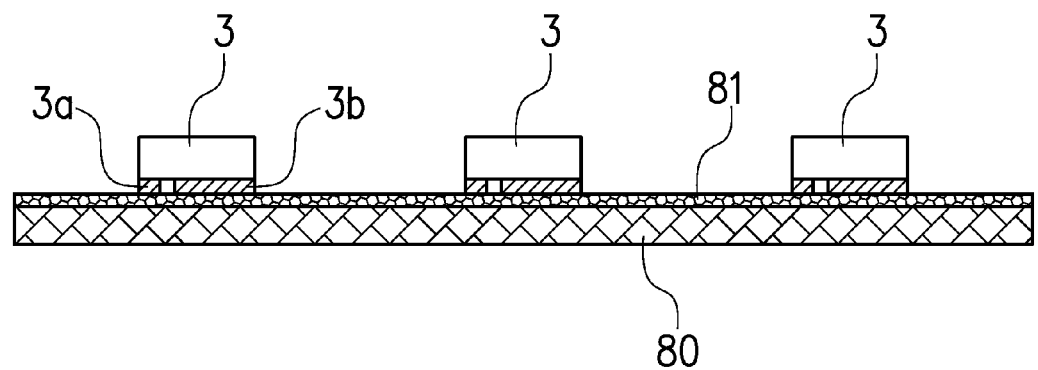
FIG. 6 is a cross-sectional view showing a condition where a plurality of light-emitting elements are arranged at given intervals on the adhesive sheet adhering to the upper surface of the jig plate shown in FIG. 5.
Figure 7:
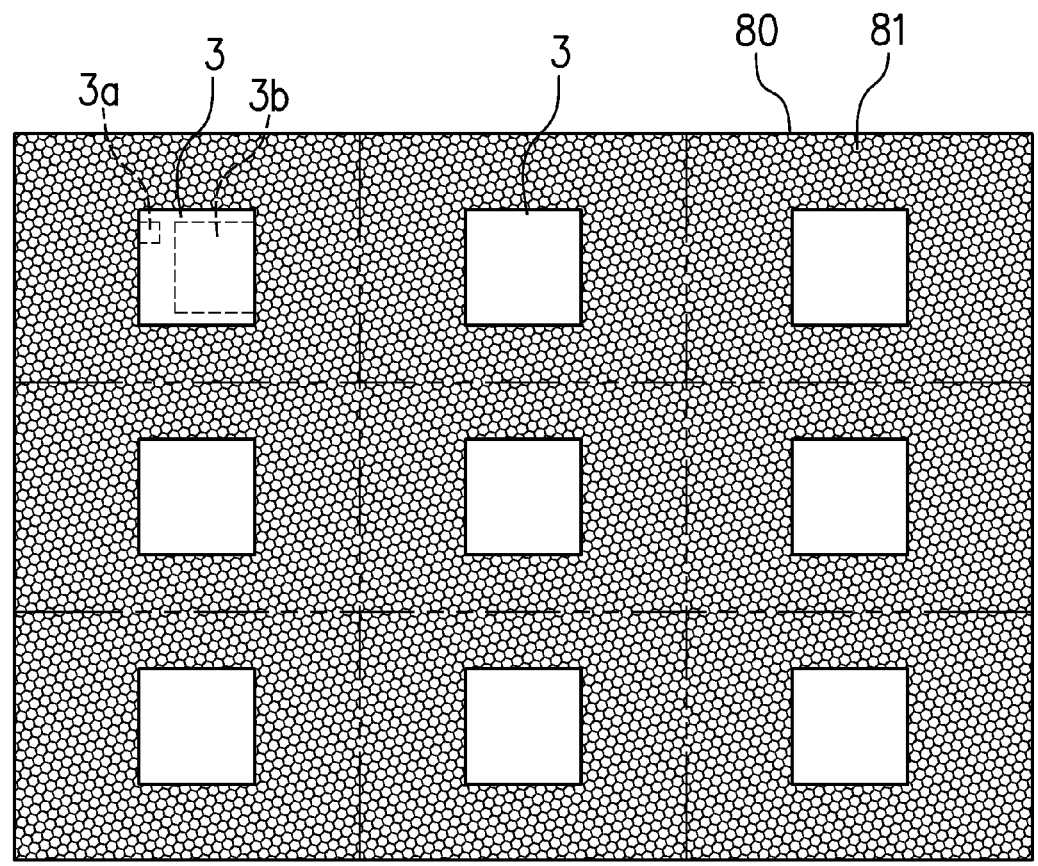
FIG. 7 is a plan view of the jig plate shown in FIG. 6 as viewed from the upper surface thereof.

FIGS. 6 and 7 show a step of mounting a plurality of light-emitting elements 3 on the adhesive sheet 81 adhering to the upper surface of the jig plate 80. The light-emitting elements 3 are arranged at given intervals on the adhesive sheet 81 while the N electrode 3a and the P electrode 3b being the element electrodes in a pair formed on the lower surface of each of the light-emitting elements turn downward. In FIG. 7, each of rectangular regions defined by dashed lines and formed by dividing the jig plate 80 and the adhesive sheet 81 vertically and horizontally is a region allocated for one light-emitting device 10. Further, in FIG. 7, a light-emitting element 3 on the upper left corner is given dashed lines indicating the positions of the N electrode 3a and the P electrode 3b being the element electrodes in a pair formed on the lower surface of the light-emitting element 3.

Figure 8:
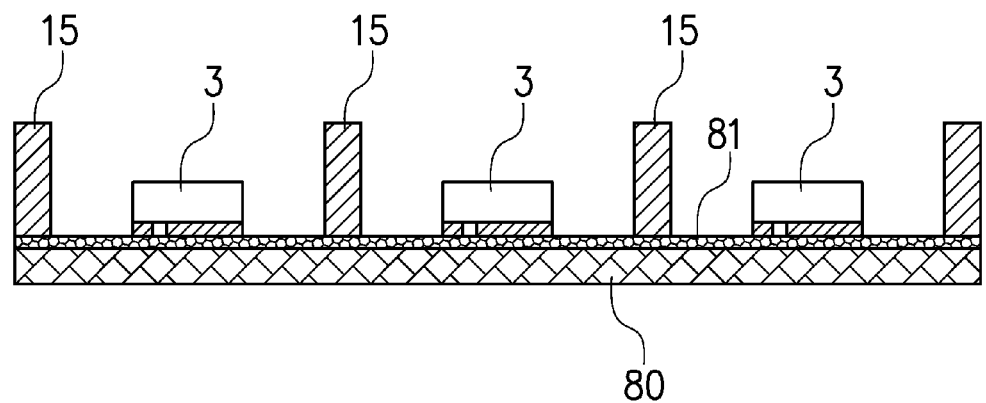
FIG. 8 is a cross-sectional view showing a condition where a reflection frame including a plurality of rectangular grids is placed on the adhesive sheet on the upper surface of the jig plate to surround each light-emitting element by one of the plurality of rectangular grids.
Figure 9:
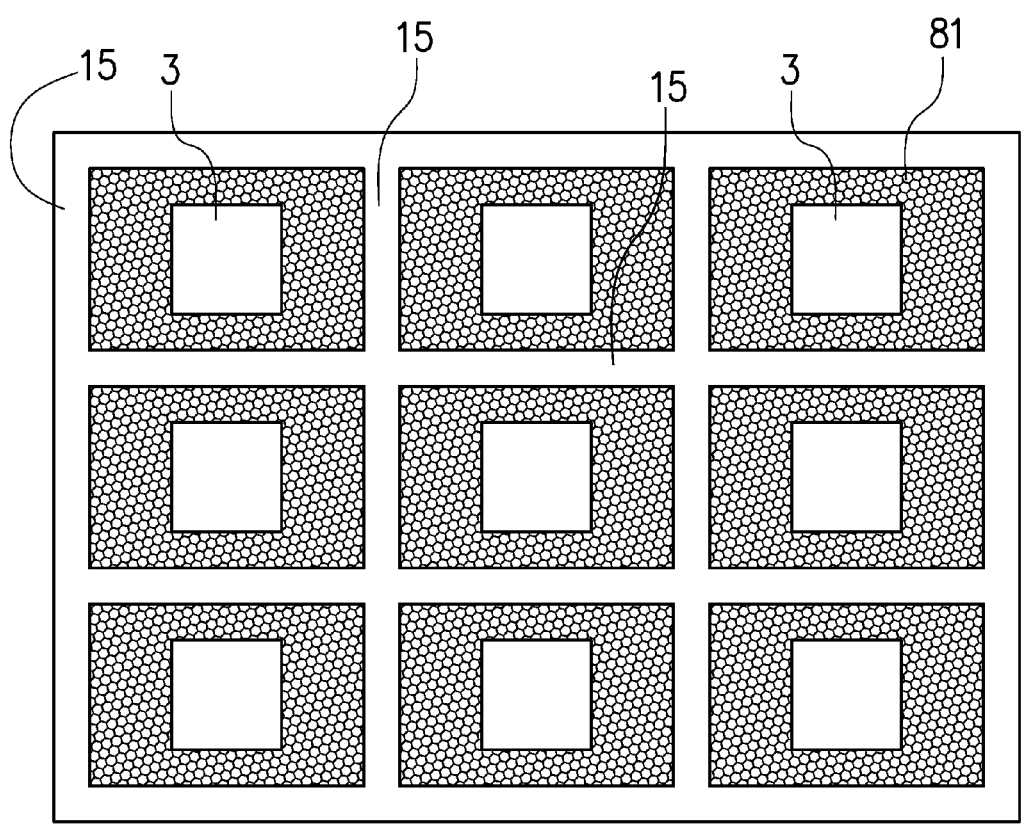
FIG. 9 is a plan view of the jig plate shown in FIG. 8 as viewed from the upper surface thereof.

FIGS. 8 and 9 show a step of placing the reflection frame 15 including a plurality of rectangular grids on the upper surface of the jig plate 80. Each reflection frame 15 is placed in a lattice pattern on the dashed lines of FIG. 7 to define the regions of the light-emitting devices 10, and each of the light-emitting elements 3 is surrounded by the reflection frame 15. As an exemplary means of placing the reflection frame 15 on the jigplate 80, the reflection frame 15 can be formed into a pattern with a plurality of rectangular grids in advance, and can be placed as it is on the adhesive sheet 81 such that each of the light-emitting elements 3 is surrounded by each reflection frame 15. Or alternatively, the plurality of light-emitting elements 3 are sealed collectively with the sealing member 5, then, in order to form a slot including the shape of a rectangular grid to surround each light-emitting element 3, the sealing member 5 is subjected to half-dicing vertically and horizontally. Then, a resin is poured into the slot and cured, thereby forming the reflection frame 15 including a plurality of rectangular grids in situ. It is preferable that the reflection frame 15 be made of a resin including high reflectivity such as a white resin material.

Figure 10:
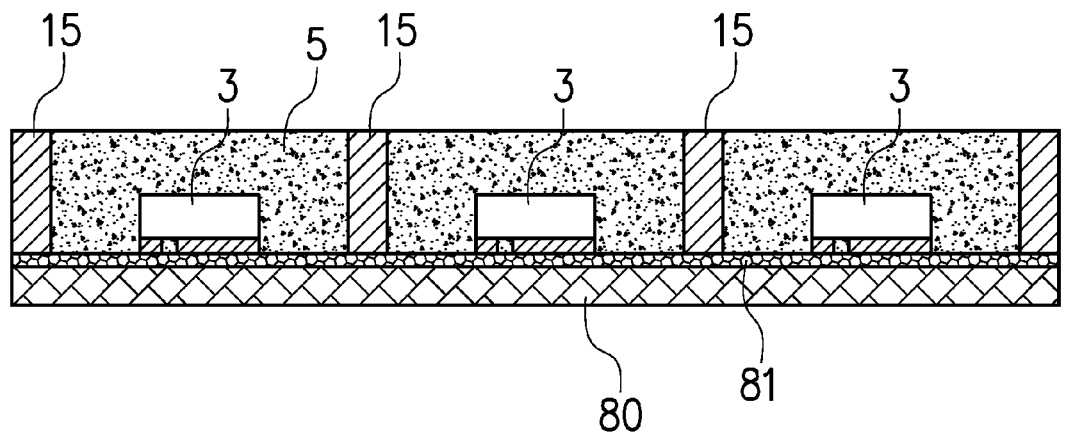
FIG. 10 is a cross-sectional view showing a condition where space inside the reflection frame is filed with a sealing member to seal the upper and side surfaces of each light-emitting element.
Figure 11:
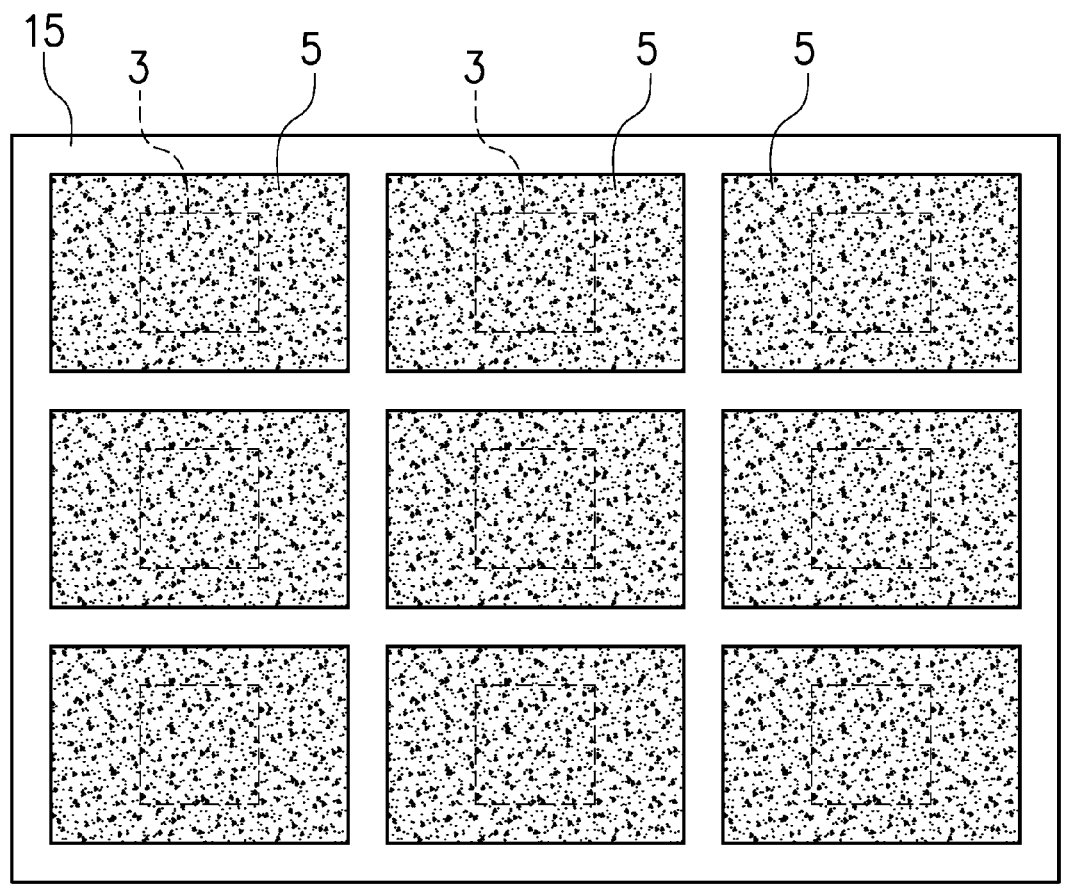
FIG. 11 is a plan view showing the plurality of resin-sealed light-emitting elements as viewed from the upper surfaces thereof each sealed with a resin and surrounded by the frame in the form of a rectangular grid.

FIGS. 10 and 11 show process of covering the upper and peripheral side surfaces of the light-emitting elements 3 and resin-sealing the light-emitting elements 3 by filling spaces surrounded by the reflection frame 15 with the sealing members 5 (in the present embodiment, a fluorescent agent-containing resin). The sealing members 5 are also poured in between the N electrode 3a and the P electrode 3b on the lower surfaces of the light-emitting elements 3 being the element electrodes in pairs projecting from the lower surfaces of the light-emitting elements 3. In FIG. 11, the positions of the light-emitting elements 3 are indicated by dashed lines.

Figure 12:
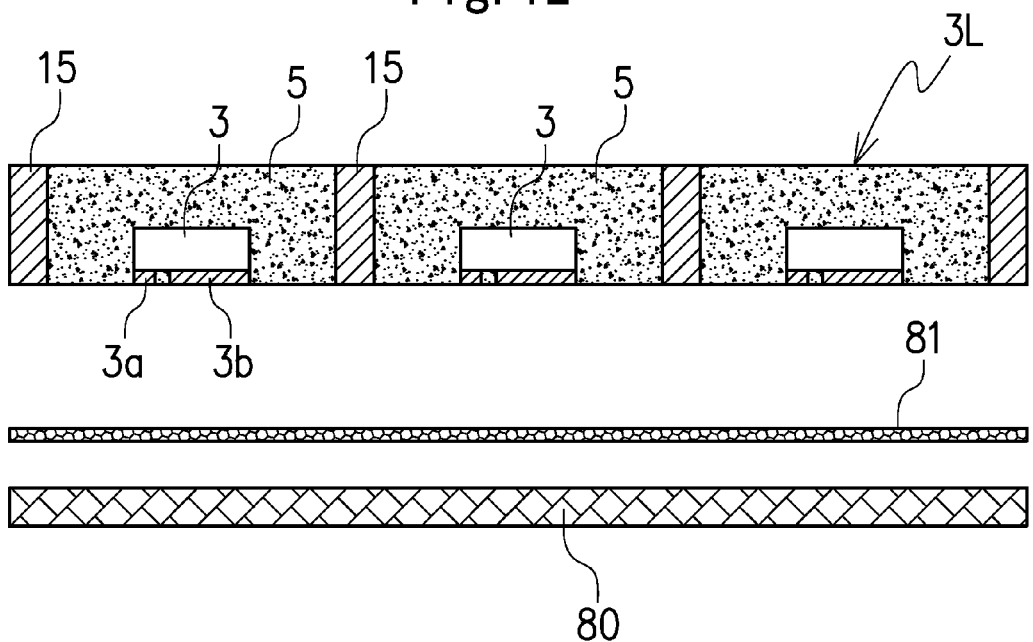
FIG. 12 is a cross-sectional view showing a condition where the jig plate and the adhesive sheet are stripped and a sealing member with the plurality of light-emitting elements collectively sealed with the sealing member is formed.
Figure 13:
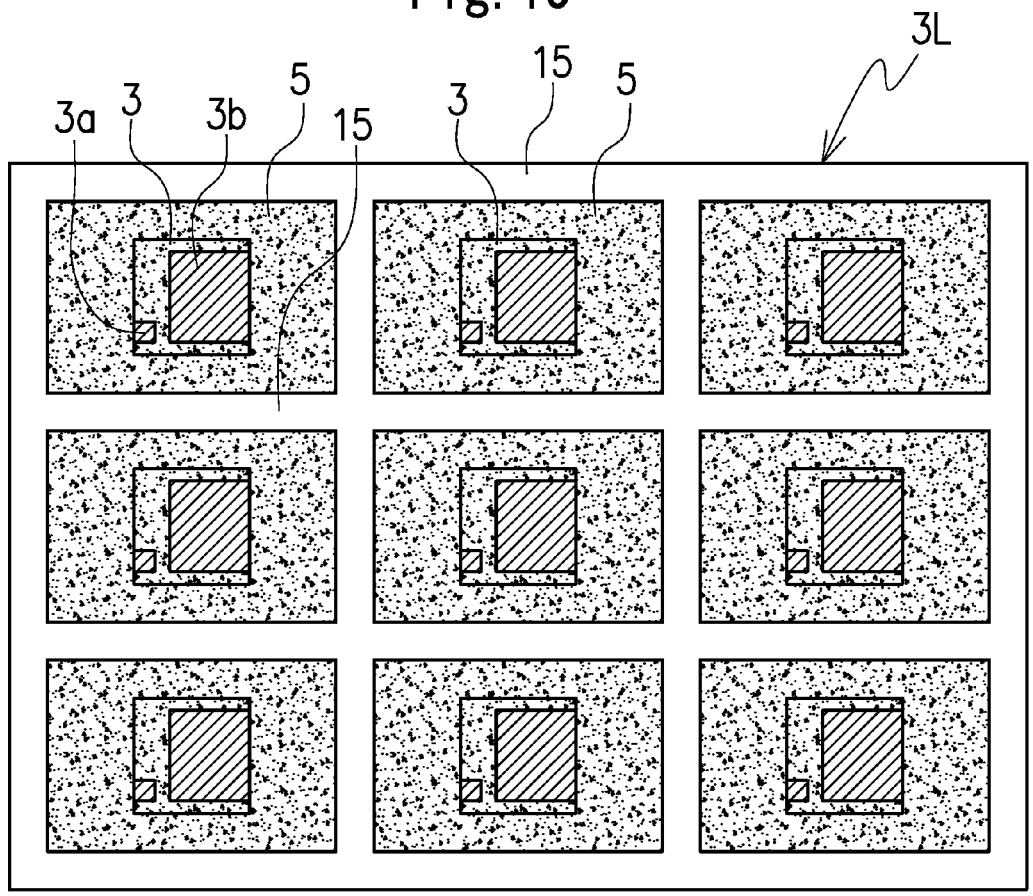
FIG. 13 is a plan view as viewed from the lower surface of the sealing member with the plurality of light-emitting elements shown in FIG. 12 collectively sealed with the sealing member, and showing a condition where the adhesive sheet is stripped from the sealing member.

FIGS. 12 and 13 show a stripping step of removing the jig plate 80 and the adhesive sheet 81 from the plurality of light-emitting elements 3 each resin-sealed in the reflection frame 15 including a rectangular grid. In this stripping step performed after the aforementioned resin-sealing step, heat is applied to remove the jig plate 80 first, and then the adhesive sheet 81 with reduced adhesive force is torn off. At this time, the lower surfaces 5a of the sealing members 5, and the lower surfaces of the N electrode 3a and the P electrode 3b being the element electrodes in pairs of the light-emitting elements 3, are flush with each other. Further, the sealing members 5 on the side of the lower surfaces of the light-emitting elements 3 and filled in between the N electrode 3a and the P electrode 3b being element electrodes are also flush with the lower surfaces of the N electrode 3a and the P electrode 3b. In the present embodiment, the lower surface of the reflection frame 15 is also flush with the sealing member and the element electrodes in pairs.

After the stripping step, a residue of the adhesive sheet 81 and the like may be attached to the lower surface of a sealing member 3L collectively resin-sealing the plurality of light-emitting elements 3. Accordingly, in order for this not to produce adverse effect on a next step, cleaning process is desirably performed. Plasma process with argon gas may be performed as the cleaning process, for example.

Figure 14:
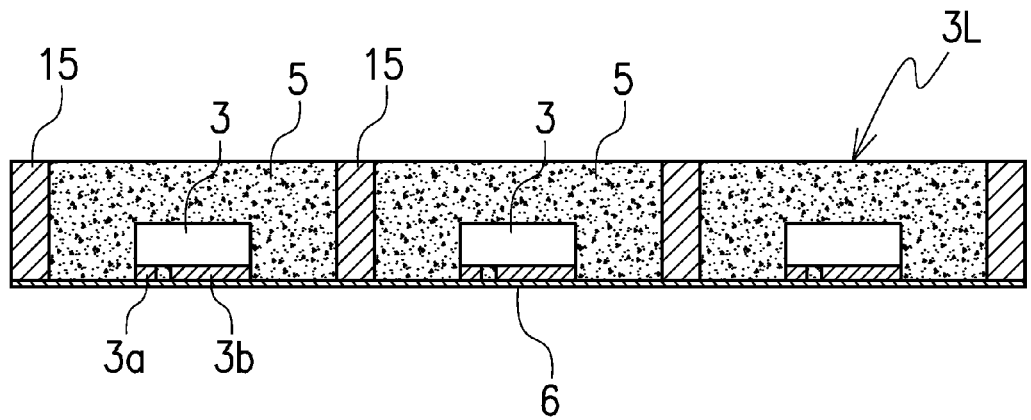
FIG. 14 shows a condition where the entire lower surface of the sealing member with the plurality of light-emitting elements shown in FIG. 12 collectively sealed with the sealing member and the lower surfaces of element electrodes in a pair of each of the plurality of light-emitting elements are flush with the lower surface of the sealing member, and where a base electrode film is formed to cover the lower surface of the sealing member and the lower surfaces of the element electrodes in a pair of each of the light-emitting elements.
Figure 15:
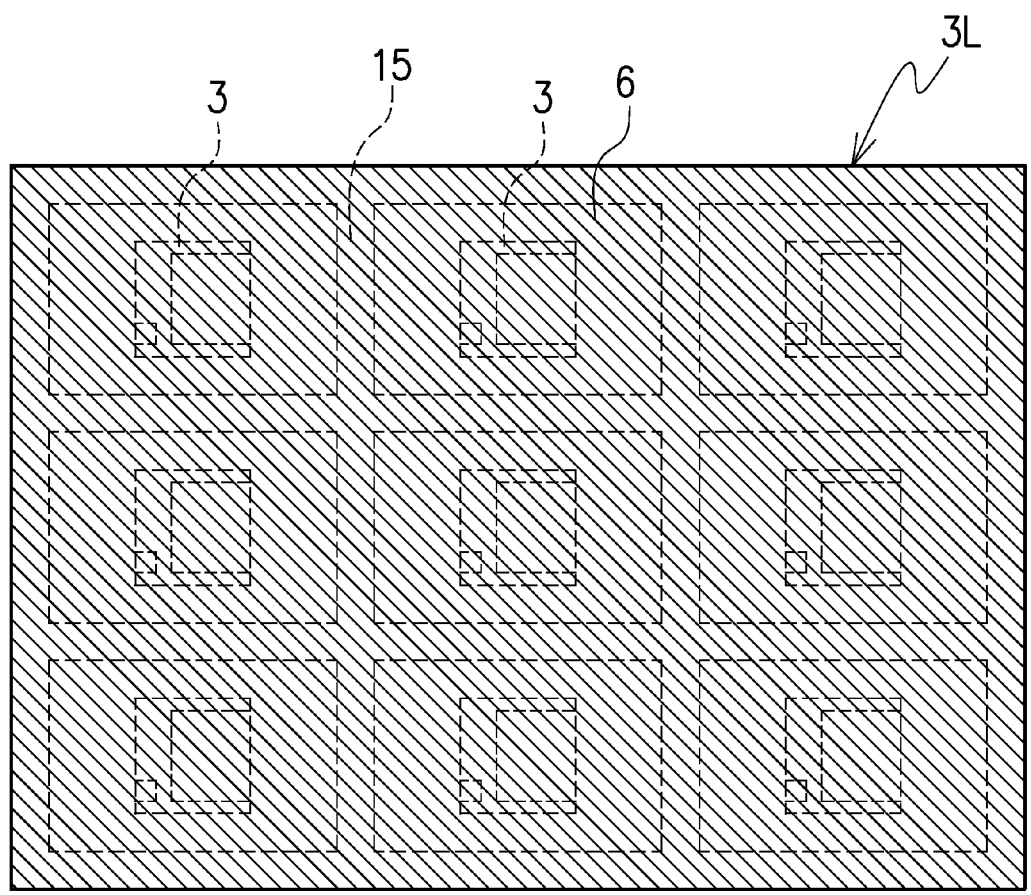
FIG. 15 is a plan view showing the plurality of collectively resin-sealed light-emitting elements shown in FIG. 14 as viewed from the lower surfaces thereof.

FIGS. 14 and 15 show a metal layer forming step of forming the base electrode film 6 on the entire lower surface of the sealing member 3L collectively resin-sealing the plurality of light-emitting elements 3. As already described above, on the side of the lower surface of the sealing member 3L collectively resin-sealing the plurality of light-emitting elements 3, the lower surfaces of the N electrode 3a and the P electrode 3b being the element electrodes in a pair of each of the light-emitting elements 3 and the lower surfaces 5a of the sealing members 5 are flush with each other. As a result of formation of the base electrode film 6 in the form of a plane surface on the entire lower surface of the sealing member 3L collectively resin-sealing the plurality of light-emitting elements 3, the N electrode 3a and the P electrode 3b being the element electrodes in pairs of all the light-emitting elements 3 are electrically short-circuited. The base electrode film 6 also functions as a reflection film, and accordingly, it is desirably formed by using metal including favorable conductive property and favorable reflectivity such as silver (Ag).

Figure 16:
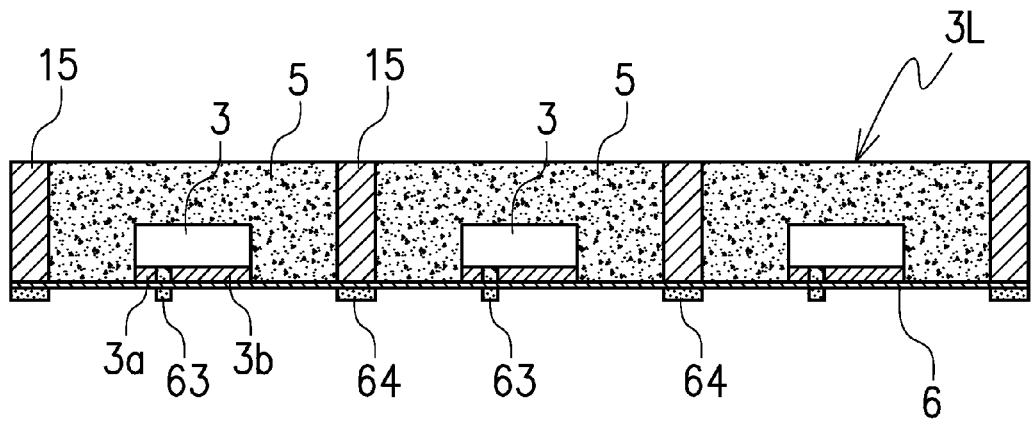
FIG. 16 is a cross-sectional view showing a condition where resist masks are formed on the lower surface of the base electrode film provided on the lower surface of the sealing member collectively resin-sealing the plurality of light-emitting elements shown in FIG. 14.
Figure 17:
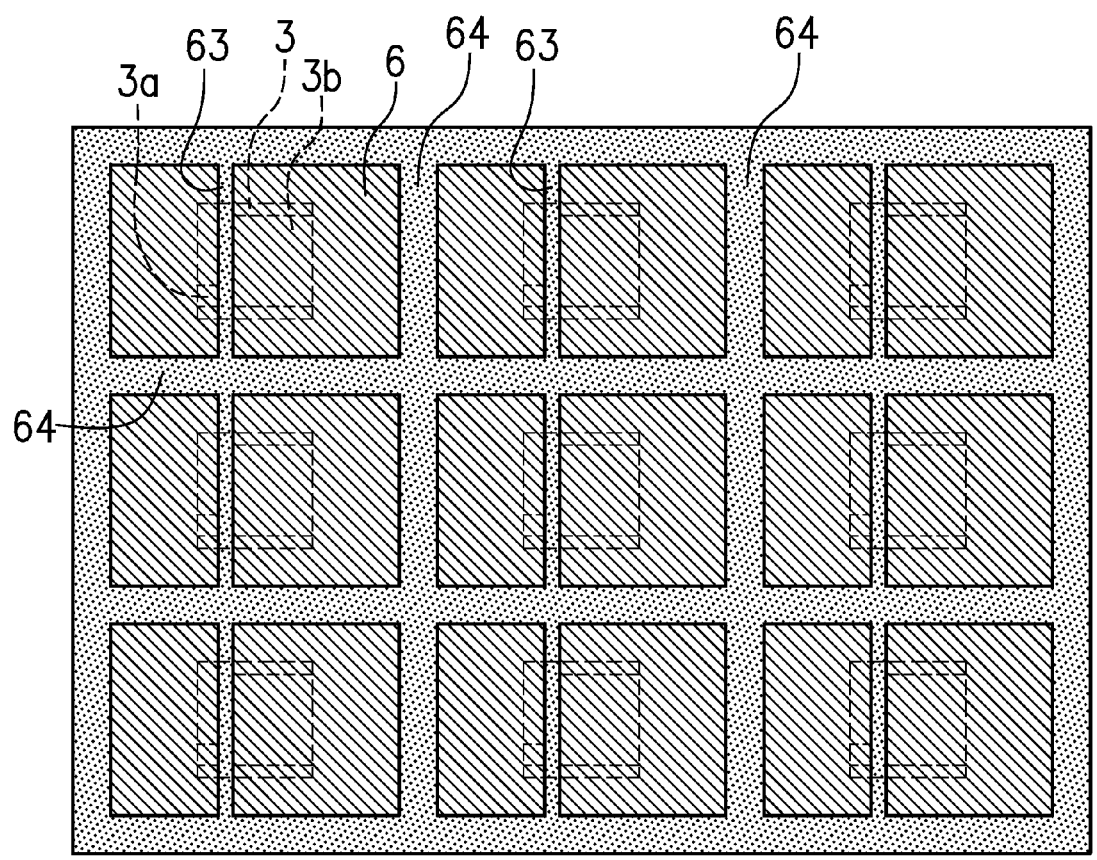
FIG. 17 is a plan view showing the sealing member collectively resin-sealing the plurality of light-emitting elements shown in FIG. 16 as viewed from the lower surface thereof.

FIGS. 16 and 17 show a step of forming resist masks on the upper surface of the base electrode film 6 to form external connection electrodes in a pair configured to be electrically connected to the N electrode 3a and the P electrode 3b being the element electrodes of each light-emitting element 3. The N electrode 3a and the P electrode 3b being the element electrodes in a pair of each light-emitting element 3 are provided in contact with the upper surface of the base electrode film 6. When the resist masks are formed, a first resist mask 63 for electrode division is formed on the lower surface of the base electrode film 6 and at a position corresponding to a position between the N electrode 3a and the P electrode 3b being element electrodes, and a second resist mask 64 is formed on the upper surface of the base electrode film 6 and at a position corresponding to each reflection frame 15. As an example, the resist masks 63 and 64 are formed by entirely forming a resist film and then by photolithography using a mask of a lattice pattern by which the resist film is exposed.

Figure 18:
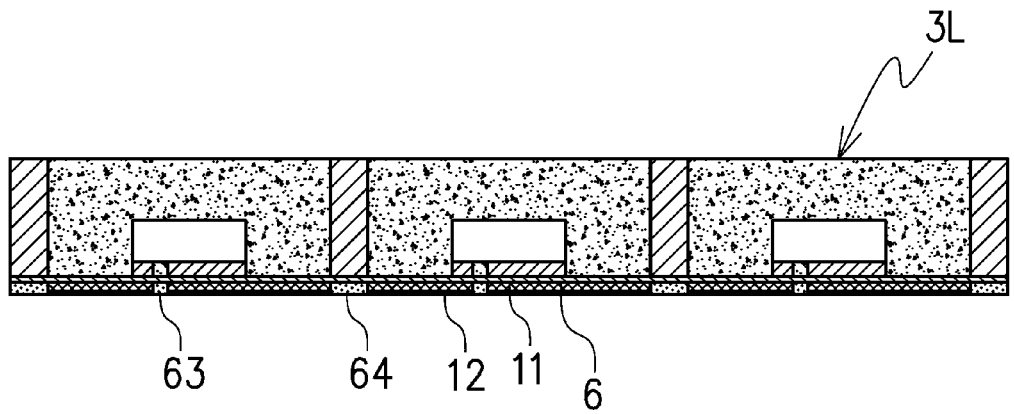
FIG. 18 is a cross-sectional view showing a condition where metal for external connection electrode is formed by plating in openings in the resist masks shown in FIG. 16.
Figure 19:
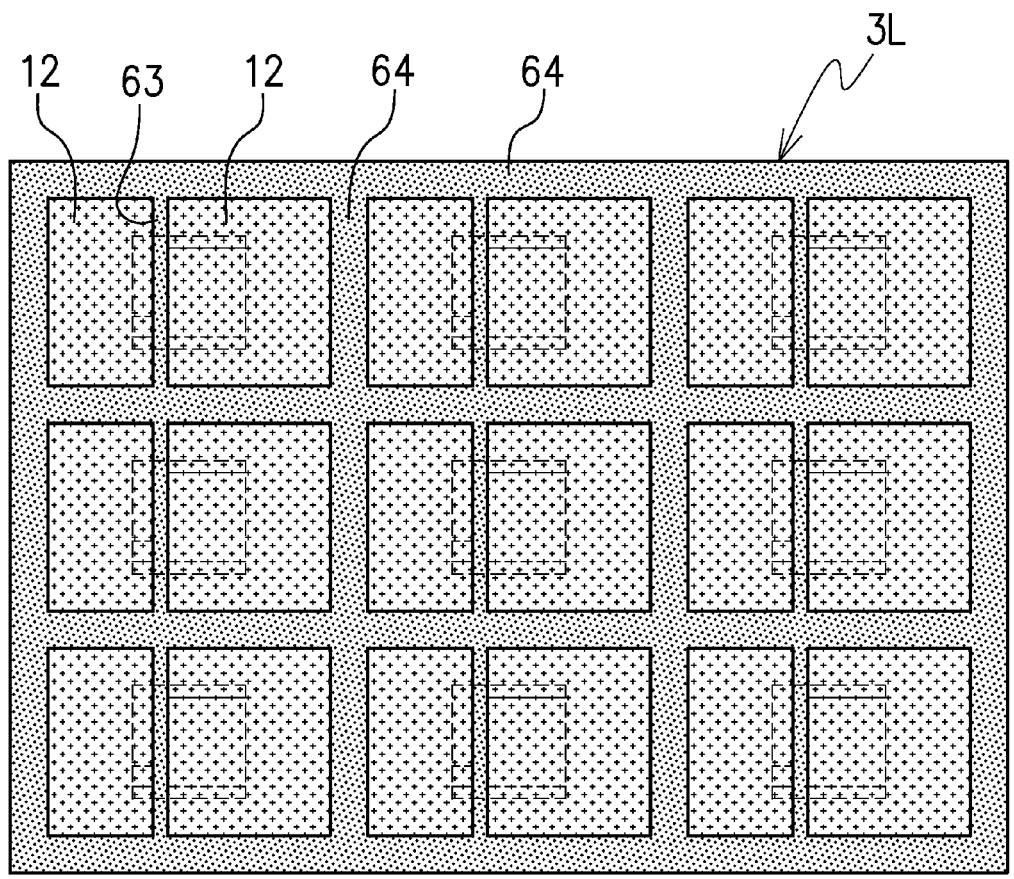
FIG. 19 is a plan view showing the sealing member collectively resin-sealing the plurality of light-emitting elements shown in FIG. 18 as viewed from the lower surface thereof.

FIGS. 18 and 19 show a plating step of forming metal for external connection electrode by plating in mask opening portions of the resist masks 63 and 64 formed on the upper surface of the base electrode film 6. In this step, the nickel layers 11 and the gold layers 12 are formed by plating in this order in the mask opening portions to become a layered structure.

Figure 20:
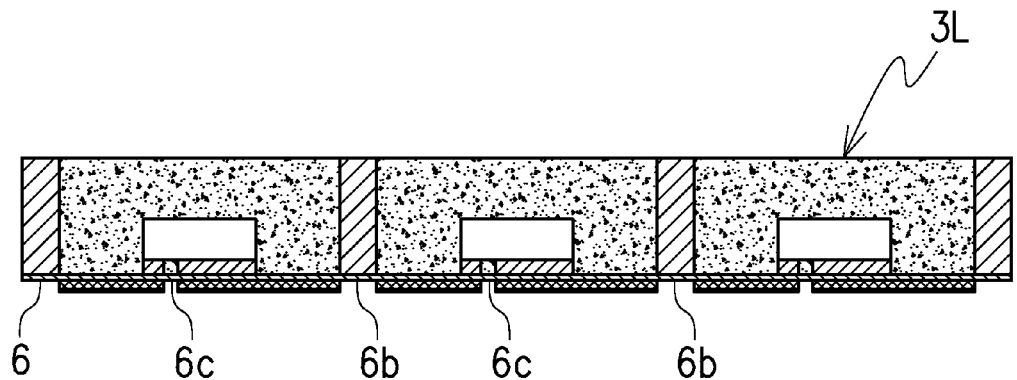
FIG. 20 is a cross-sectional view showing a condition where the resist masks are removed from the lower surface of the sealing member collectively resin-sealing the plurality of light-emitting elements shown in FIG. 18.
Figure 21:
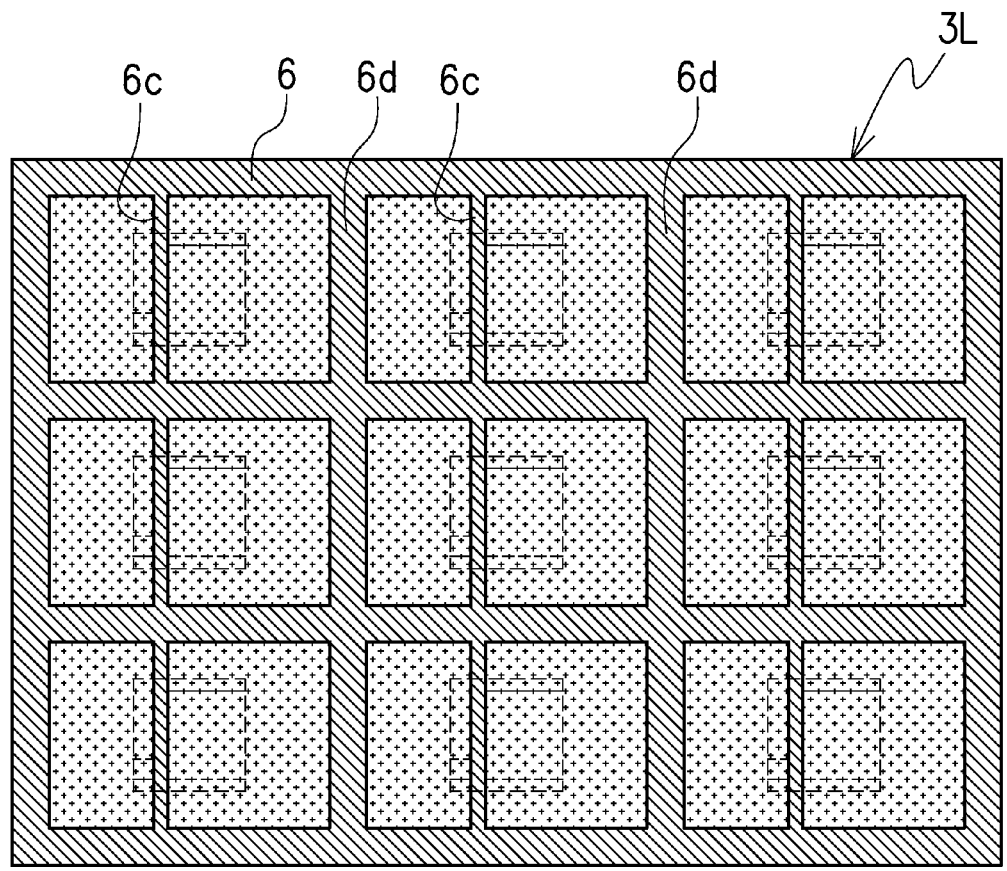
FIG. 21 is a plan view showing the sealing member collectively resin-sealing the plurality of light-emitting elements shown in FIG. 20 as viewed from the lower surface thereof.

FIGS. 20 and 21 show a mask removing step of removing the resist masks 63 and 64. In this step, the resist masks 63 and 64 can be dissolved and removed by dipping the sealing member 3L collectively resin-sealing the plurality of light-emitting elements 3 in an organic solvent or an aqueous solution of an organic alkali. Base electrode films 6c are exposed at portions from which the first resist masks 63 have been removed, and base electrode films 6d are exposed at portions from which the second resist masks 64 have been removed.

Figure 22:
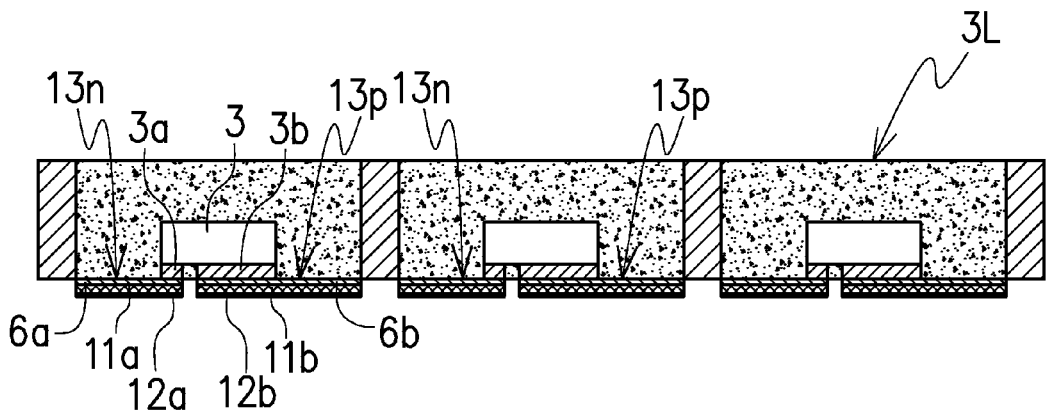
FIG. 22 is a cross-sectional view showing a condition where the base electrode film defined between an N external connection electrode and a P external connection electrode is removed by using the metal for external connection electrode as a mask provided by plating to the sealing member collectively resin-sealing the plurality of light-emitting elements shown in FIG. 20.
Figure 23:
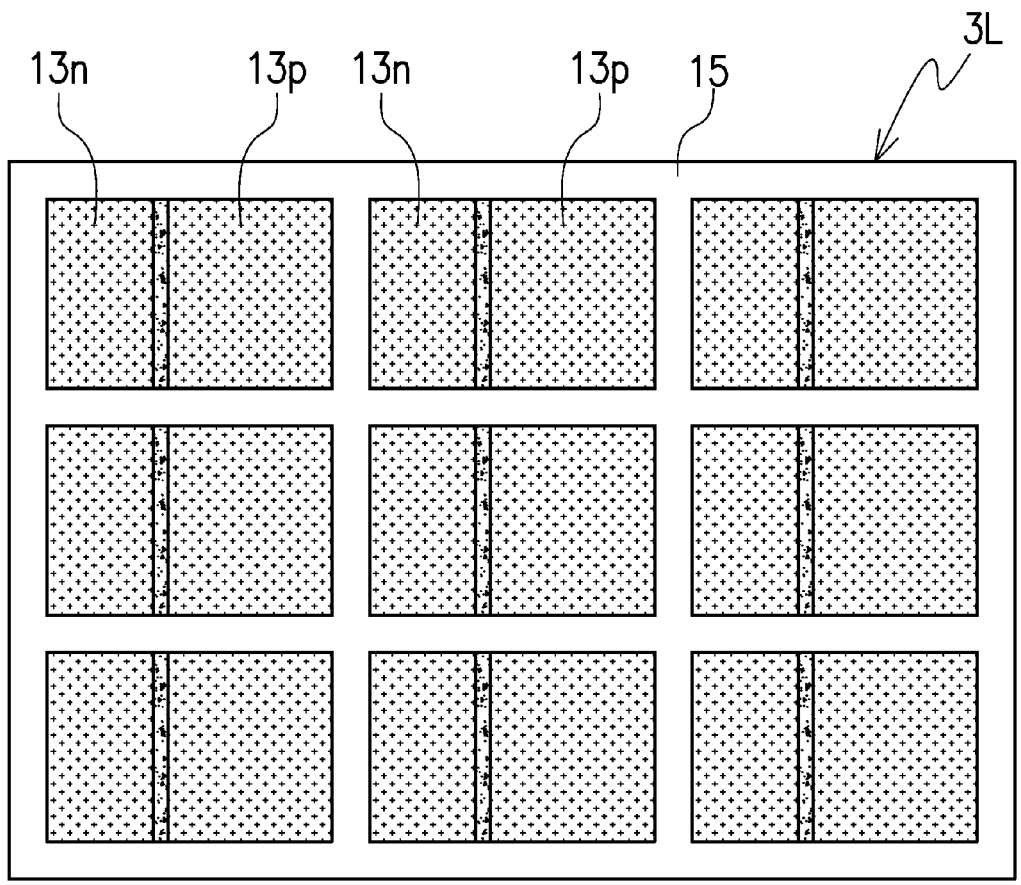
FIG. 23 is a plan view showing the sealing member collectively resin-sealing the plurality of light-emitting elements shown in FIG. 22 as viewed from the lower surface thereof.

FIGS. 22 and 23 show an electrode dividing step of etching the base electrode films 6c and 6d exposed in the mask removing step. In this step, a publicly known method is employed to perform etching by using the metal for external connection electrode composed of the nickel layers 11 and the gold layers 12 as a mask. As a result, the exposed base electrode films 6c and 6d are removed.

As a result of this step, the base electrode film 6 is divided at positions corresponding to positions between the N electrode 3a and the P electrode 3b being the element electrodes of the light-emitting elements 3. Then, the N external connection electrodes 13n each including a three layer structure with the N electrode base film 6a, the nickel layer 11a, and the gold layer 12a are formed on the side of the N electrodes 3a. Further, the P external connection electrodes 13p each including a three layer structure with the P electrode base film 6b, the nickel layer 11b, and the gold layer 12b are formed on the side of the P electrodes 3b.

Figure 24:
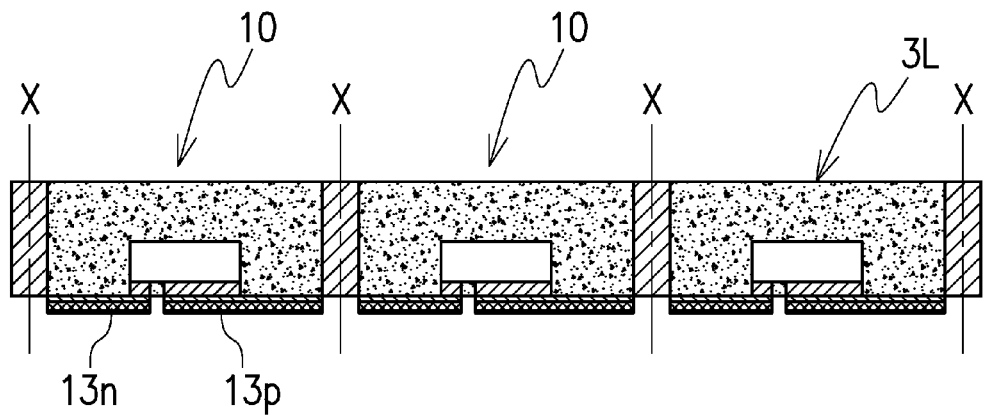
FIG. 24 is a cross-sectional view showing a condition where light-emitting devices are formed individually by cutting and dividing the sealing member collectively resin-sealing the plurality of light-emitting elements shown in FIG. 22.
Figure 25:
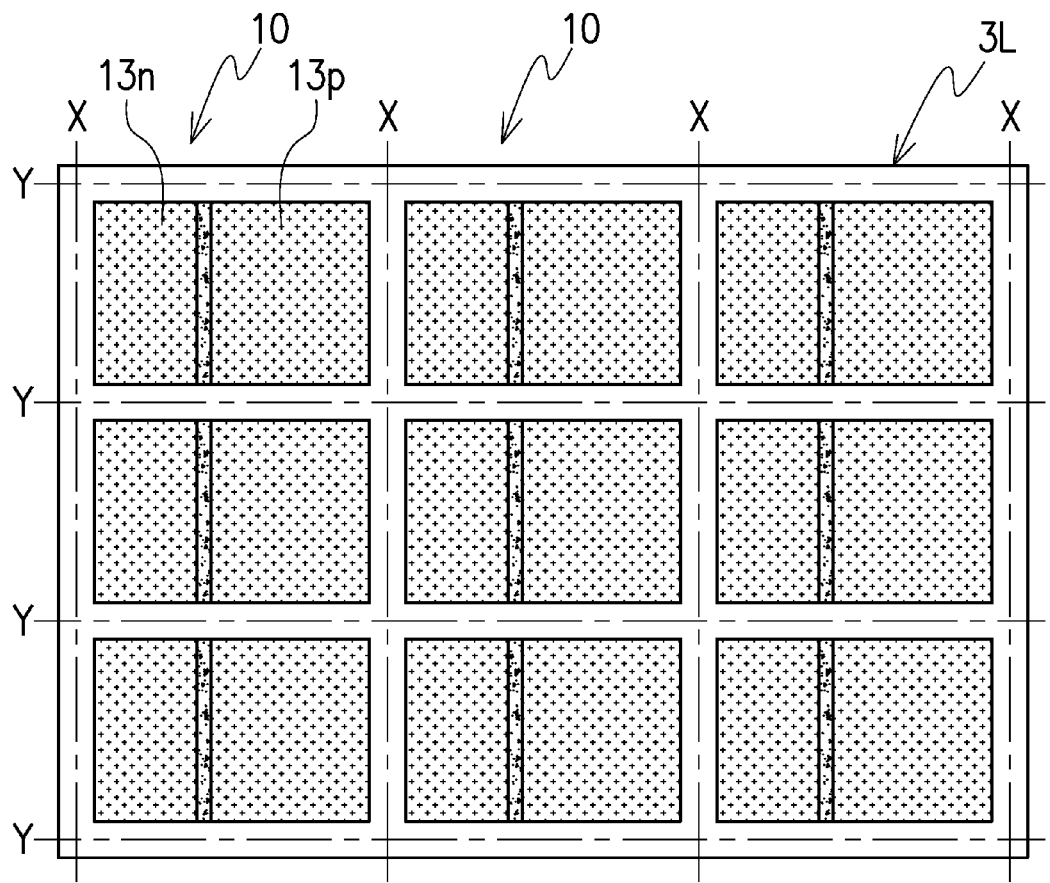
FIG. 25 is a plan view showing the sealing member collectively resin-sealing the plurality of light-emitting elements shown in FIG. 24 as viewed from the lower surface thereof.

FIGS. 24 and 25 show a cutting and dividing step of forming the light-emitting devices 10 individually by cutting and dividing the sealing member 3L collectively resin-sealing the plurality of light-emitting elements 3. In this step, cutting lines X and Y in X and Y directions extending along the reflection frame 15 composed of rectangular grids are defined, and the sealing member 3L collectively resin-sealing the plurality of light-emitting elements 3 are cut along the cutting lines X and Y. As a result of this cutting, the light-emitting devices 10 are divided to mass-produce the individual light-emitting devices 10 each including the light-emitting element 3 including the shape shown in FIG. 1. In the present embodiment, the cutting lines X and Y are defined to extend along the substantially center line of the reflection frame 15.

As described above, in the method of producing a light-emitting device according to the present embodiment, the sealing member 3L collectively resin-sealing the plurality of light-emitting elements 3 are formed on a temporary substrate formed by using the jig plate 80 and the adhesive sheet 81. Then, using the fact that the bottom surface of the sealing member 3L collectively resin-sealing the plurality of light-emitting elements 3 becomes flush after the temporary substrate is removed, the external connection electrodes are formed by plating and photoresist technique. As a result, the light-emitting devices 10 each including light-emitting element are formed that do not require substrates on which the light-emitting elements are mounted. The light-emitting devices 10 with light-emitting elements can be formed even if the step of providing the reflection frame 15 is omitted from the aforementioned steps. Further, plating process such as electroless plating process, deposition process, and sputtering process may be employed in place of electrolytic plating process employed to form the external connection electrodes 13n and 13p in pairs. In this case, the base electrode film 6 is not required.

(Second Embodiment)

Figure 26:
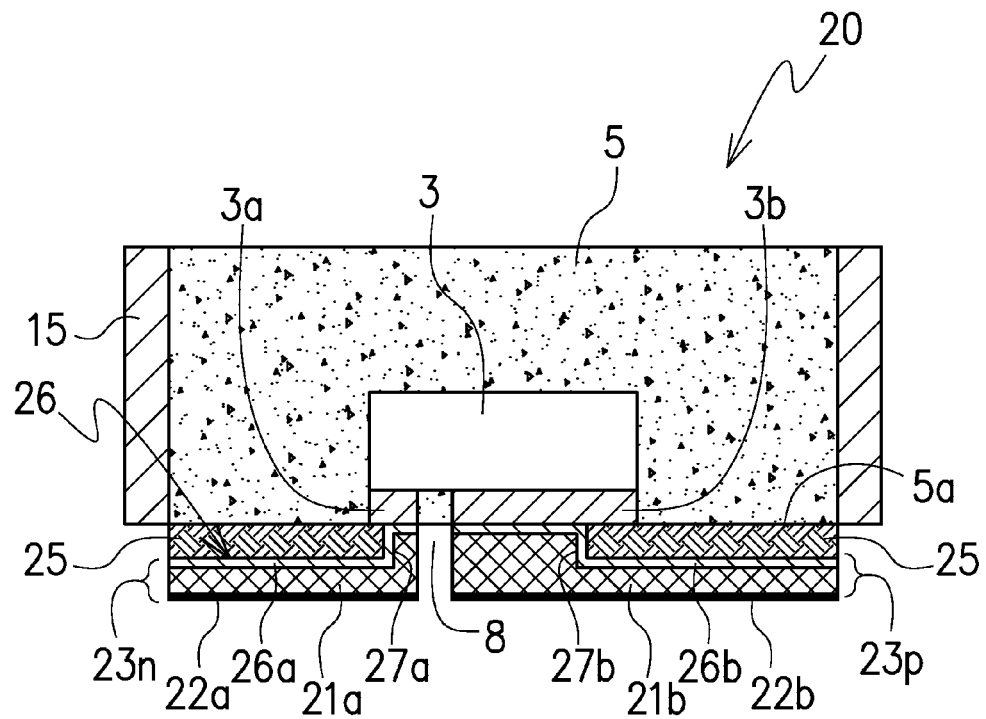
FIG. 26 is a cross-sectional view of a light-emitting device in a second embodiment of the invention.

FIG. 26 shows a light-emitting device produced by a production method according to a second embodiment of the present invention. FIGS. 27 to 32 show steps of the production method according to the second embodiment.

A light-emitting device 20 according to the present embodiment has the same basic structures as those of the light-emitting device 10 according to the first embodiment shown in FIG. 1. Accordingly, the same structures are identified by the same reference numbers, and will not be described in detail.

The structure of the light-emitting device 20 is different from that of the previously described light-emitting device 10 in that a protection film 25 is formed on a substantially entire lower surface 5a of a sealing member 5 resin-sealing a light-emitting element 3. The protection film 25 is formed with the intent of reinforcing the flexible sealing member 5 made of a silicone resin. The protection film 25 is capable of stabilizing an N external connection electrode 23n and a P external connection electrode 23p formed on the lower surface of the sealing member 5. The protection film 25 is also intended to improve the light-emitting efficiency of the light-emitting device 20, as it is required to have reflectivity. To satisfy these conditions, the protection film 25 is increased in strength by mixing a glass filler into a silicone resin or an epoxy resin, and is increased in reflectivity by mixing titanium oxide. It is desirable that the protection film 25 be formed extensively to cover necessary portions by following process such as screen printing and mask printing using a metal mask, for example.

A base electrode film 26 is provided to the lower surface of the protection film 25. End portions of the base electrode film 26 extend to positions where the end portions reach the lower surfaces of an N electrode 3a and a P electrode 3b being element electrodes of the light-emitting element 3. Step portions 27a and 27b are provided to the base electrode film 26 at positions where the base electrode film 26 extends from the protection film 25 to the N electrode 3a and the P electrode 3b being the element electrodes. The base electrode film 26 is divided at a cutting portion 8 into an N electrode base film 26a on the side of the N electrode 3a of the light-emitting element 3, and a P electrode base film 26b on the side of the P electrode 3b of the light-emitting element 3. A material used to form the base electrode film 26 is required to function as a base electrode. Accordingly, it is preferable that the material be an alloy of titanium and tungsten (TiW) including favorable conductive property and etching performance.

A nickel (Ni) layer 21a and a gold (Au) layer 22a are formed by plating over the entire N electrode base film 26a, thereby forming the N external connection electrode 23n of a three layer structure. Likewise, a nickel (Ni) layer 21b and a gold (Au) layer 22b are formed by plating over the entire P electrode base film 26b, thereby forming the P external connection electrode 23p of a three layer structure. In the present embodiment, the P external connection electrode 23p is connected to the P electrode 3b of the light-emitting element 3 in a wide area, to release heat effectively from the P external connection electrode 23p.

A method of producing the light-emitting device 20 will next be described based on FIGS. 27 to 32. The production method according to the present embodiment is basically the same as the method of producing the light-emitting device 10 of the first embodiment. Accordingly, the steps same as those of the method of producing the light-emitting device 10 are applied here, and these steps are not described repeatedly. Like in the method of producing the light-emitting device 10 of the first embodiment, the light-emitting devices 20 are formed in mass production by using a large-sized jig plate. Meanwhile, for simplification of the description of the production method, only one light-emitting device 20 in intermediate stages is shown in the drawings.

The steps from the step of placing an adhesive sheet adhesively on the upper surface of a jig plate and mounting a plurality of light-emitting elements on the adhesive sheet to the stripping step of removing the jig plate and the adhesive sheet from the resin-sealed light-emitting elements in the present embodiment are the same as those of the production method according to the first embodiment, and therefore, they are not described here.

Figure 27:
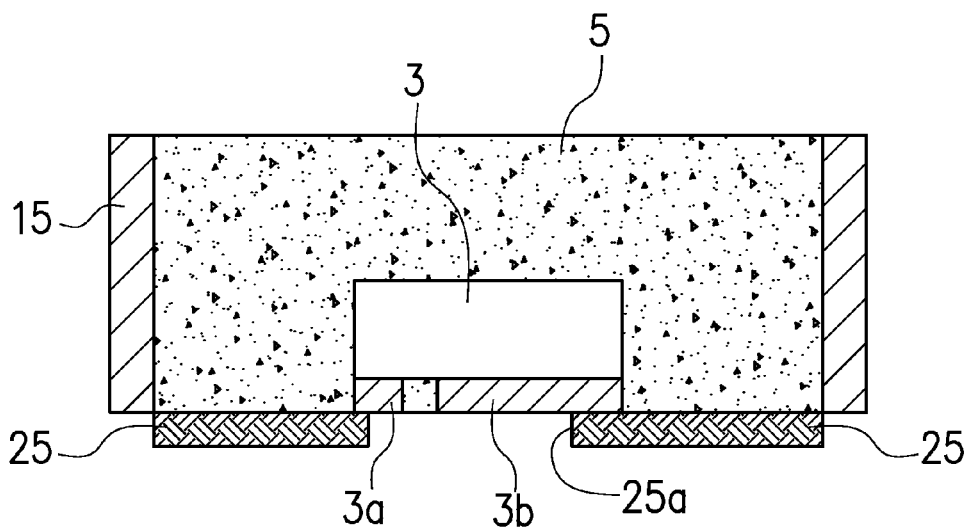
FIG. 27 is a cross-sectional view showing a method of producing the light-emitting device shown in FIG. 26, and showing a condition where a protection film is formed on the bottom surface of a sealing member collectively resin-sealing a plurality of light-emitting elements after an adhesive sheet is stripped.

FIG. 27 shows a step of forming the protection film on the lower surface 5a of the sealing member 5 after the adhesive sheet is stripped from a sealing member 3L (called the same name as that of a collective sealing member while only one sealing member is shown in the drawing) collectively resin-sealing a plurality of light-emitting elements 3. In the protection film forming step, the protection film 25 is formed on the substantially entire lower surface 5a of the sealing member 5 while an opening portion 25a is defined in a portion corresponding to the positions of the N electrode 3a and the P electrode 3b being the element electrodes formed on the lower surface of the light-emitting element 3. The protection film 25 extends to positions where the protection film 25 reaches portions of the N electrode 3a and the P electrode 3b being the element electrodes formed on the lower surface of the light-emitting element 3. A silicone resin or an epoxy resin is used to form the protection film 25. A glass filler is mixed into the silicone or epoxy resin to increase its strength, and titanium oxide is mixed into the silicone or epoxy resin to increase its reflectivity. The protection film 25 can be formed by following process such as screen printing and mask printing using a metal mask.

Figure 28:
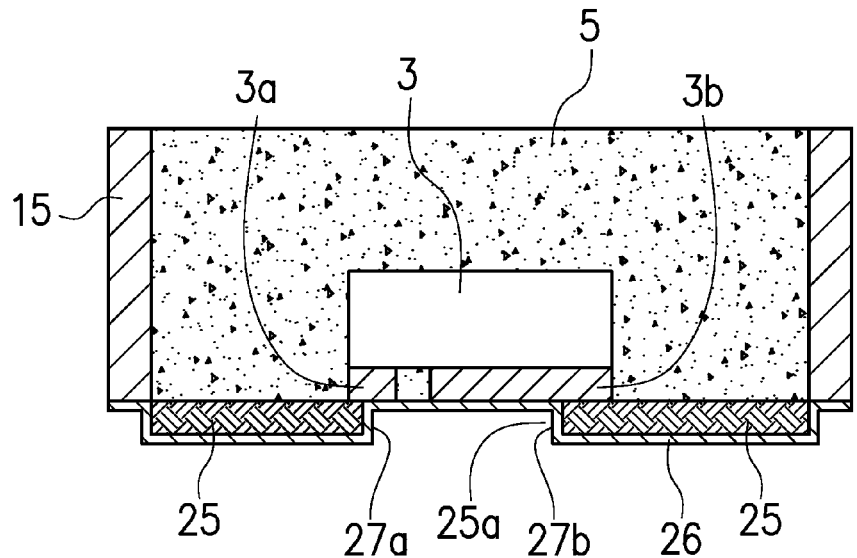
FIG. 28 is a cross-sectional view showing a condition where a base metal film is formed on the lower surface of the protection film formed on the lower surface of the sealing member collectively resin-sealing the plurality of light-emitting elements shown in FIG. 27.

FIG. 28 shows a metal layer forming step of forming the base electrode film 26 on the entire lower surface of the sealing member 5 resin-sealing the light-emitting element 3. In this metal layer forming step, the base electrode film 26 is formed continuously so as to cover the protection film 25 and the lower surfaces of the N electrode 3a and the P electrode 3b being the element electrodes in a pair exposed in the opening portion 25a. The base electrode film 26 is provided with the step portions 27a and 27b provided at the end portions of the opening portion 25a of the protection film 25. The base electrode film 26 is required only to function as a base electrode for plating. Accordingly, it is preferable that the base electrode film 26 be made of TiW (alloy of titanium and tungsten) including favorable conductive property and etching performance.

Figure 29:
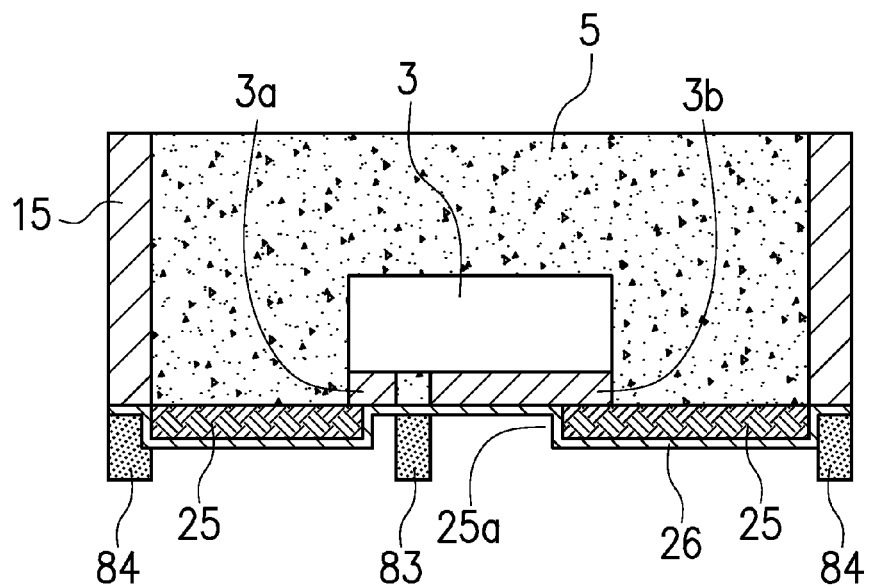
FIG. 29 is a cross-sectional view showing a condition where resist masks are formed on the base electrode film of the sealing member collectively resin-sealing the plurality of light-emitting elements shown in FIG. 28.

FIG. 29 shows a mask step of forming resist masks on the lower surface of the base electrode film 26 to divide the N electrode 3a and the P electrode 3b being the element electrodes in a pair of the light-emitting element 3 from each other. In the mask step, a first resist mask 83 is formed on the lower surface of the base electrode film 26 and at a position corresponding to a position between the N electrode 3a and the P electrode 3b being the element electrodes in a pair of each light-emitting element 3, and a second resist mask 64 is formed on the lower surface of the base electrode film 26 and at a position corresponding to each reflection frame 15. Like in the production method of the first embodiment, the resist masks 83 and 84 can be formed by photolithography.

Figure 30:
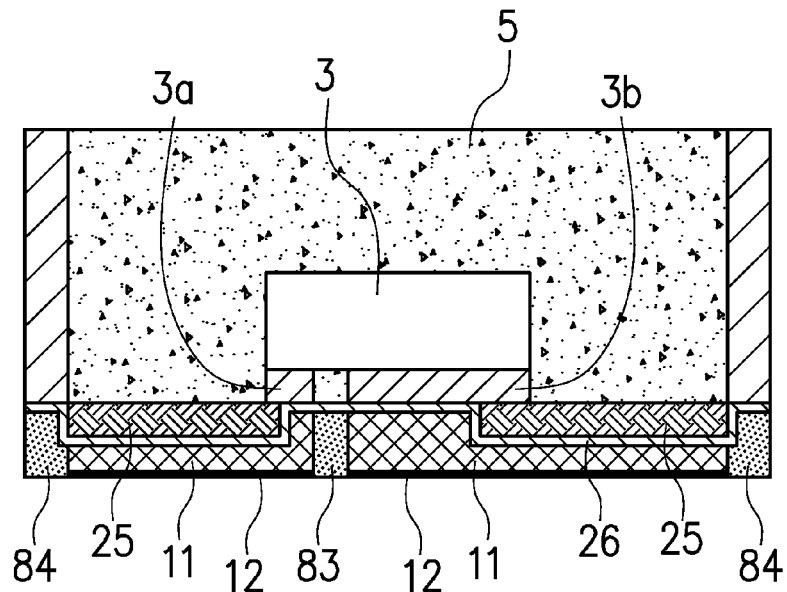
FIG. 30 is a cross-sectional view showing a condition where metal for external connection electrode is formed by plating in openings of resist masks of the sealing member collectively resin-sealing the plurality of light-emitting elements shown in FIG. 29.

FIG. 30 shows a plating step of forming metal for external connection electrode by plating in mask opening portions of the resist masks 83 and 84 formed on the lower surface of the base electrode film 26 (on portions of the lower surface of the base electrode film 26 exposed from the resist masks 83 and 85). In this step, a nickel layer 11 and a gold layer 12 are formed by plating in this order in the entire mask opening portions to become a layered structure. At this time, the nickel layer 11 is formed on the base electrode film 26 to fill the opening portion 25a of the protection film 25, thereby making the lower surface of the nickel layer 11 flat. Then, the thickness of the plated gold layer 12 formed on the lower surface of the nickel layer 11 is made uniform.

Figure 31:
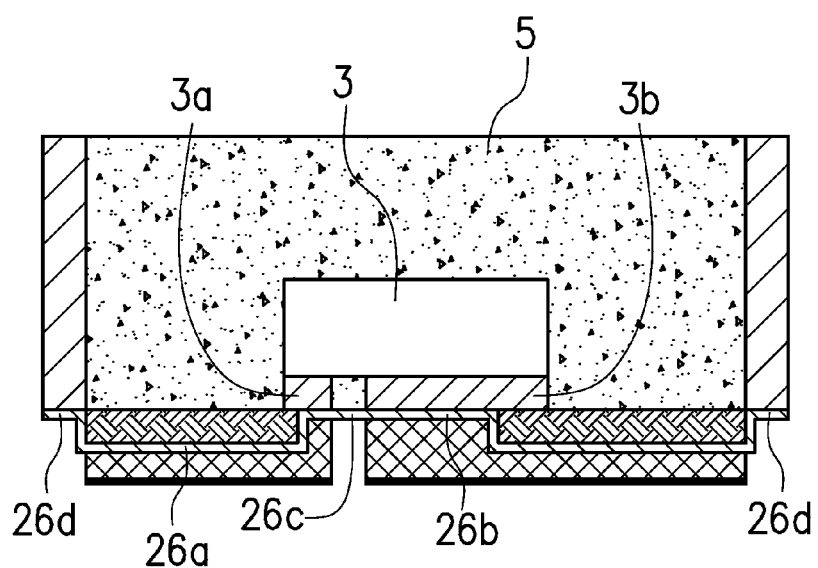
FIG. 31 is a cross-sectional view showing a condition where the resist masks of the sealing member collectively resin-sealing the plurality of light-emitting elements shown in FIG. 30 are removed.

FIG. 31 shows a mask removing step of removing the resist masks. In this step, the first resist mask 83 and the second resist mask 84 can be removed by following the same process as that of the first embodiment. The lower surface of a base electrode film 26c is exposed at a portion from which the first resist mask 83 has been removed, and the lower surface of a base electrode film 26d is exposed at a portion from which the second resist mask 84 has been removed.

Figure 32:
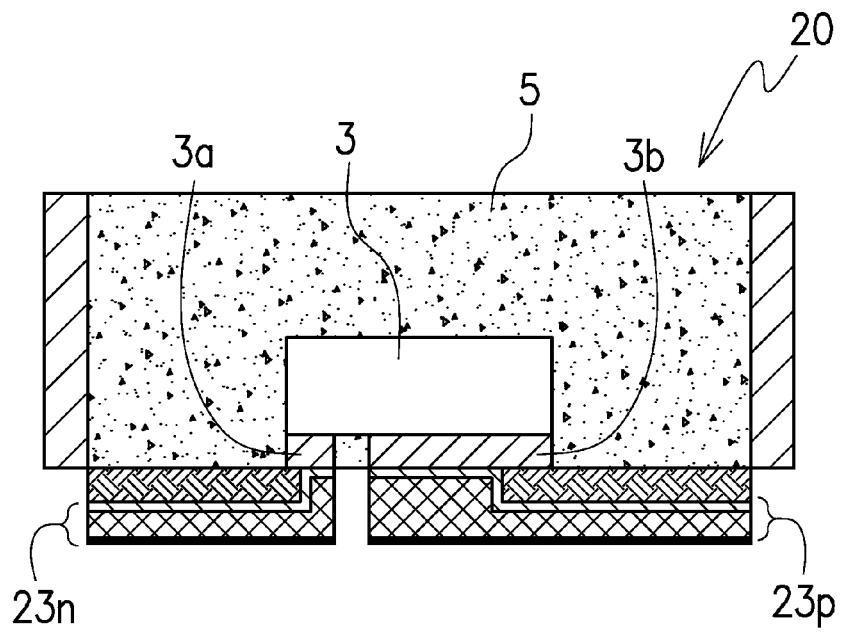
FIG. 32 is a cross-sectional view showing a condition where the base electrode film defined between an N external connection electrode and a P external connection electrode is removed by using the metal for external connection electrode of the sealing member collectively resin-sealing the plurality of light-emitting elements shown in FIG. 31.

FIG. 32 shows an electrode dividing step of etching the base electrode films 26c and 26d exposed in the above-mentioned mask removing step. In this step, a publicly known method is employed to etch the exposed base electrode films 26c and 26d by using the metal for external connection electrode composed of the nickel layer 11 and the gold layer 12 as a mask. As a result, the exposed base electrode films 26c and 26d are removed.

As a result of this step, the base electrode film 26 is divided into the N electrode base film 26a electrically connected to the N electrode 3a being an element electrode of the light-emitting element 3, and the P electrode base film 26b connected to the P electrode 3b being an element electrode of the light-emitting element 3. Then, the N external connection electrode 23n of a three layer structure with the N electrode base film 26a, the nickel layer 11a, and the gold layer 12a is formed on the side of the N electrode 3a being an element electrode. Further, the P external connection electrode 23p of a three layer structure with the P electrode base film 26b, the nickel layer 11b, and the gold layer 12b is formed on the side of the P electrode 3b being an element electrode. As a result, formation of the light-emitting device 20 shown in FIG. 26 is completed.

The light-emitting device 20 is mounted on the external substrate 70 by the same means as that of the light-emitting device 10 of FIG. 3. Further, the operation of the light-emitting device 20 is the same as that of the light-emitting device 10 shown in FIG. 3. The light-emitting device 20 is different from the light-emitting device 10 according to the first embodiment in that the base electrode film does not function as a reflection member as it is. Instead, the protection film 25 including the function of a reflection member is formed and then the base electrode film is formed on the protection film 25, and the N external connection electrode 23n and the P external connection electrode 23p extend over the sealing member 5 while the protection film 25 is placed between the N and P external connection electrodes 23n and 23p and the sealing member 5.

As shown in FIG. 26, the light-emitting device 20 according to the present embodiment does not include a substrate on which a light-emitting element is to be mounted. Accordingly, the light-emitting device 20 can be reduced in thickness while it is mounted on the external substrate 70. Not providing a substrate on which a light-emitting element is to be mounted also makes it possible to cause heat generated in the light-emitting element 3 to escape directly to the interconnection electrodes 71 and 72 of the external substrate 70 through the N external connection electrode 23n and the P external connection electrode 23p. This achieves considerably high heat dissipation effect. Further, the protection film 25 is allowed to have reflectivity, and TiW providing favorable etching performance can be used to form the base electrode film.

(Third Embodiment)

Figure 33:
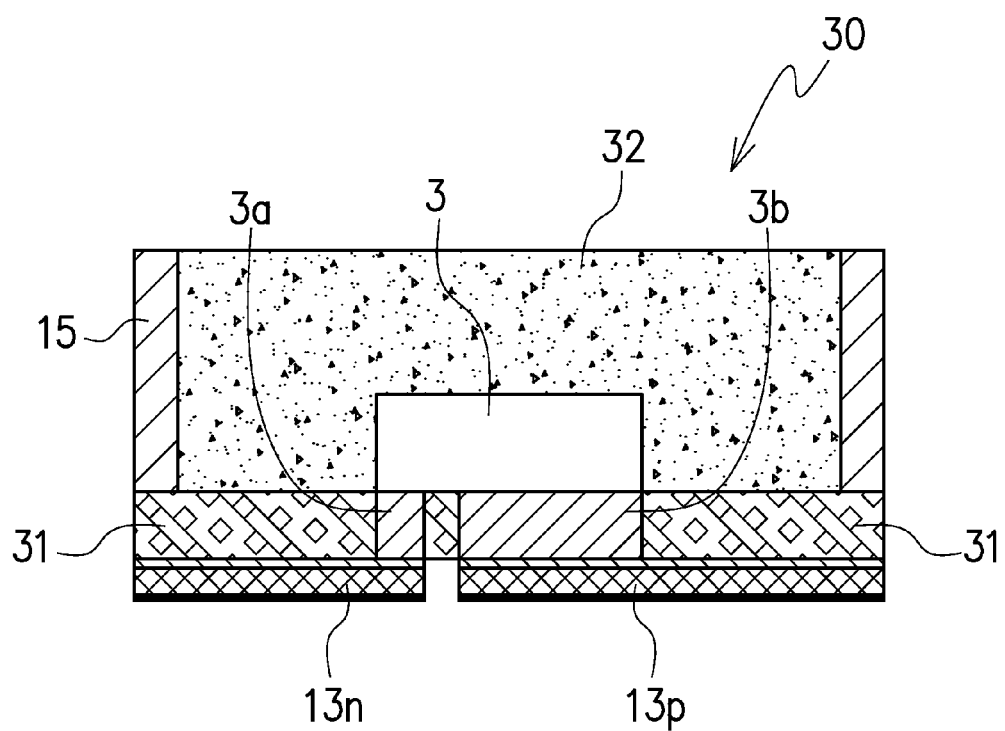
FIG. 33 is a cross-sectional view of a light-emitting device in a third embodiment of the invention.

FIG. 33 shows a light-emitting device obtained by a production method according to a third embodiment of the invention. FIG. 34 shows characteristic steps of the production method according to the third embodiment. Members corresponding to those of the first embodiment are denoted by the same reference numbers, and will not be described in detail.

As shown in FIG. 33, a light-emitting device 30 of the third embodiment includes: a light-emitting element 3 including an upper surface, a lower surface, a peripheral surface extending between the upper and lower surfaces, and element electrodes in a pair formed on the lower surface; a sealing member sealing the light-emitting element 3 and arranged so as to expose the element electrodes in a pair of the light-emitting element 3; and external connection electrodes in a pair electrically connected to the element electrodes in a pair of the light-emitting element 3 and provided on the sealing member. The sealing member includes a first sealing member 31 provided around the element electrodes, and a second sealing member 32 sealing the upper and peripheral side surfaces of the light-emitting element 3. To be more specific, the light-emitting device 30 includes the light-emitting element 3 including an N electrode 3a and a P electrode 3b being element electrodes in a pair provided on the lower surface of the light-emitting element 3, and the sealing member sealing the light-emitting element 3. The N electrode 3a and the P electrode 3b being the element electrodes of the light-emitting element 3 are composed of projecting electrodes such as gold bumps. The sealing member has a two layer structure with the first and second sealing members 31 and 32. For example, a white ceramic ink is used to form the first sealing member 31 sealing at least the surroundings of the N electrode 3a and the P electrode 3b. Further, a fluorescent agent-containing resin is used to form the second sealing member 32 sealing at least the peripheral side surface and the upper surface of the light-emitting element 3. The gold bumps project to a height of about 30 μm, for example. Further, an N external connection electrode 13n and a P external connection electrode 13p composed of external connection electrodes in a pair are formed on the lower surface of the first sealing member 31. Further, the outer periphery of the second sealing member 32 is surrounded by a reflection frame 15 in the form of a rectangular grid.

The white ceramic ink to constitute the first sealing member 31 is formed by blending reflective particles such as those of titanium oxide together with a catalyst and a solvent into a binder made of organo polysiloxane, for example, and by sintering a resultant mixture. It is preferable that the sintered white ceramic ink have a thickness of from about 30 to about 50 μm. The sintered white ceramic ink becomes a vitrified (inorganic) material. Examples of the fluorescent agent-containing resin constituting the second sealing member 32 include a silicone resin containing a fluorescent material such as YAG. Like in the first embodiment, the reflection frame 15 is made of a silicone resin containing reflective fine particles, and the N external connection electrode 13n and the P external connection electrode 13p are metal patterns formed by electrolytic plating process as in the first embodiment.

Figure 34A:
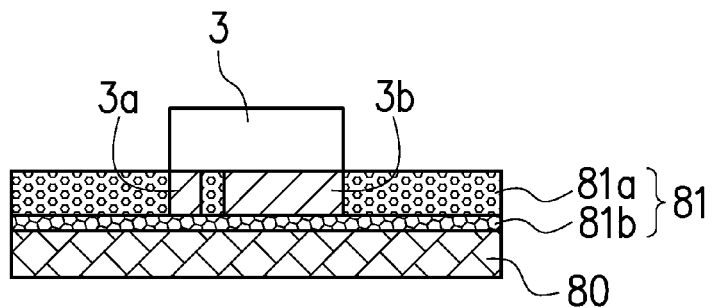
FIG. 34 includes explanatory views showing a method of producing the light-emitting device shown in FIG. 33.

The method of producing the light-emitting device 30 will next be described based on FIG. 34. FIG. 34 mainly shows a sealing step different from that of the first embodiment. Like in the above-described embodiment, a single light-emitting device 30 is shown in FIG. 34 for simplification of the description. FIG. 34A shows a light-emitting element placing step of placing the light-emitting element 3 on an adhesive sheet 81 adhering to a jig plate 80 such that element electrodes (the N electrode 3a and the P electrode 3b) turn downward. The adhesive sheet 81 is composed of a base layer 81b covering the upper surface of the jig plate 80, and an adhesive glue layer 81a stacked on the upper surface of the base layer 81b. The light-emitting element 3 is pressed from above against the adhesive glue layer 81a to bury the N electrode 3a and the P electrode 3b of the light-emitting element 3 in the adhesive glue layer 81a to such an extent that the N electrode 3a and the P electrode 3b disappear.

Figure 34B:
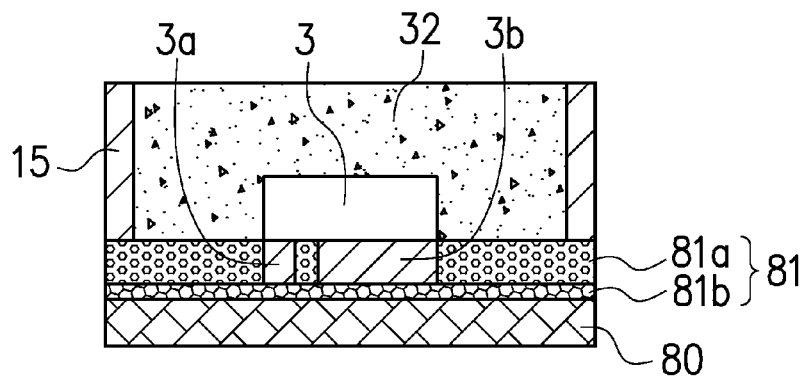
Figure 34C:
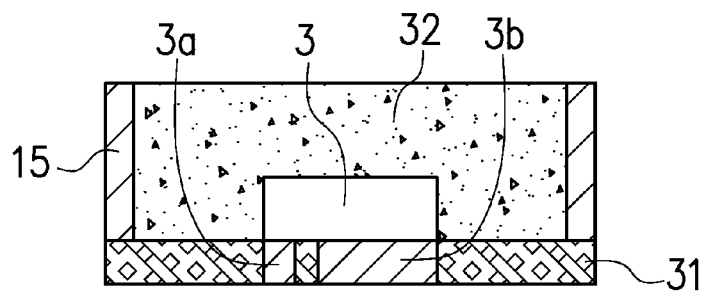

FIGS. 34B and C show a step of sealing the light-emitting element 3. In the present embodiment, the N electrode 3a and the P electrode 3b being the element electrodes of the light-emitting element 3 are buried in the adhesive glue layer 81a. Accordingly, sealing of the light-emitting element 3 through the lower surface thereof is a problem to be solved. In view of this, a portion above the adhesive glue layer 81a is filled first with the second sealing member 32 to seal the light-emitting element 3 as shown in (b). For the filling, the reflection frame 15 shaped into a rectangular grid is used as in the first embodiment. Alternatively, the reflection frame is resin-molded in situ with a die. Or, a plurality of light-emitting elements 3 is sealed with the second sealing member 32 made of a transparent resin or a light-transmitting resin, and then, in order to form a slot in the form of a rectangular grid around each of the light-emitting elements 3, the second sealing member 32 is subjected to half-dicing vertically and horizontally. Then, a resin exhibiting reflection effect such as a white resin is poured into the slot, thereby forming the reflection frame by resin-molding. Next, the jig plate 80 and the adhesive sheet 81 are stripped from the light-emitting element 3 sealed with the second sealing member 32 to expose the lower surface of the second sealing member 32 and the N electrode 3a and the P electrode 3b being the element electrodes of the light-emitting element 3. Then, as shown in FIG. 34C, the first sealing member 31 is formed so as to cover the lower surface of the second sealing member 32 and the N electrode 3a and the P electrode 3b being the exposed element electrodes. Regarding formation of the first sealing member 31, the white ceramic ink is first applied to the lower surface of the second sealing member 32 so as to have a relatively great thickness. The white ceramic ink is also applied to the lower surfaces of the N electrode 3a and the P electrode 3b being the element electrodes to entirely cover them. Next, the white ceramic ink is cured at a temperature of about 150° C., and thereafter, the lower surface of the white ceramic ink is grined to expose the lower surfaces of the N electrode 3a and the P electrode 3b that are configured to be the element electrodes. Instead of applying and grinding the white ceramic ink, the white ceramic ink may be printed and then sintered.

Figure 34D:
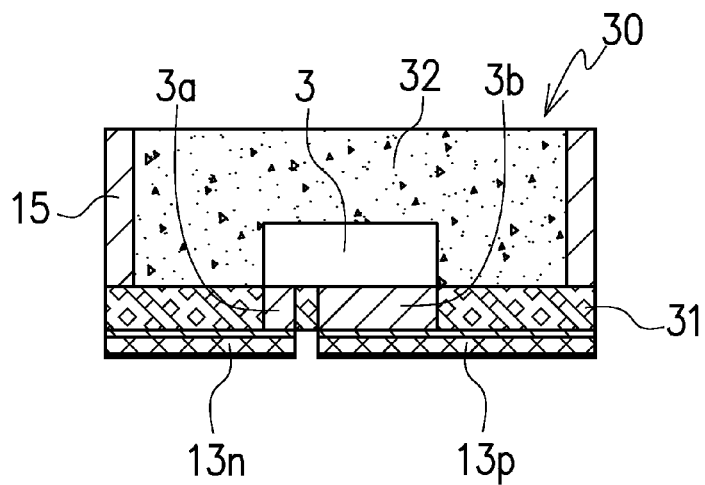

FIG. 34D shows a step of forming external connection electrodes on the lower surface of the first sealing member 31. In this step, the N external connection electrode 13n connected to the N electrode 3a being the element electrode of the light-emitting element 3, and the P external connection electrode 13p to be connected to the P electrode 3b being the element electrode of the light-emitting element 3, are formed in the same manner as that of the first embodiment on the lower surface of the first sealing member 31 with which the light-emitting element 3 is sealed as described above. Like in the embodiments described above, the N external connection electrode 13n and the P external connection electrode 13p each have a three layer structure with a base electrode film, a nickel layer, and a gold layer.

In the present embodiment, the first sealing member 31 is made of a white ceramic ink, and the second sealing member 32 is made of a fluorescent agent-containing resin. Meanwhile, the materials of the first and second sealing members 31 and 32 are not limited thereto. By way of example, the first sealing member 31 may be formed of a resin layer in which scattering particles are blended, and the second sealing member 32 may be made of a ceramic ink. This ceramic ink may or may not contain a fluorescent material.

(Fourth Embodiment)

Figure 35:
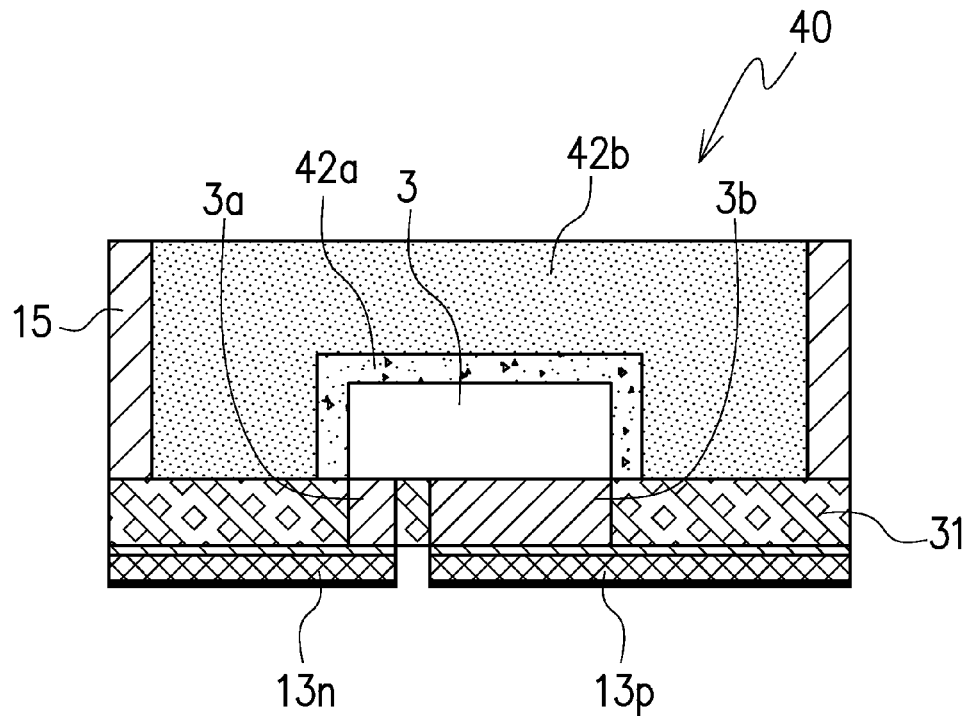
FIG. 35 is a cross-sectional view of a light-emitting device according to a fourth embodiment of the invention.

FIG. 35 is a cross-sectional view showing a light-emitting device 40 of a fourth embodiment of the present invention. The light-emitting device 40 has the same structure as that of the light-emitting device 30 of the third embodiment, except that the second sealing member 32 of the light-emitting device 30 of the third embodiment is composed of a fluorescent agent-containing resin layer 42a covering the upper and peripheral side surface of a light-emitting element 3, and a transparent resin layer 42b sealing the external side of the fluorescent agent-containing resin layer 42a. Accordingly, members corresponding to those of the light-emitting device 30 of the third embodiment are denoted by the same reference numbers, and will not be described in detail. The fluorescent agent-containing resin layer 42a has a uniform thickness of about 100 μm, and covers the entire light-emitting element 3 excluding the lower surface thereof.

For example, the fluorescent agent-containing resin layer 42a is obtained by placing a large number of light-emitting elements 3 at certain intervals on an adhesive sheet 81 adhering onto a jig plate 80, applying a fluorescent agent-containing paste with a squeegee or the like to the light-emitting elements 3, and then curing the paste. The light-emitting element 3 is coated with the fluorescent agent-containing resin layer 42a of a uniform thickness in this manner. Accordingly, light emitted upward and light emitted laterally from the light-emitting element 3 travel the same distance in the fluorescent agent-containing resin layer 42a (through the uniform thickness of the fluorescent agent-containing resin). Thus, color irregularity to be caused by light emission in different directions can be reduced. Further, light viewed as exiting the light-emitting device is limited to light emitted from around the light-emitting element 3, namely, light emitted from a surface of the fluorescent agent-containing resin layer 42a. This provides a smaller point light source and provides easier control of light distribution with a lens and the like than in the case where a fluorescent agent is added to be mixed in an entire sealing resin. Producing steps of the present embodiment including the process where external connection electrodes (N and P external connection electrodes 13n and 13p) and element electrodes (N electrode 3a and P electrode 3b) are connected by plating do not involve high-temperature process. Accordingly, not only an inorganic resin but also an organic resin is applicable as a fluorescent paste.

(Fifth Embodiment)

Figure 36:
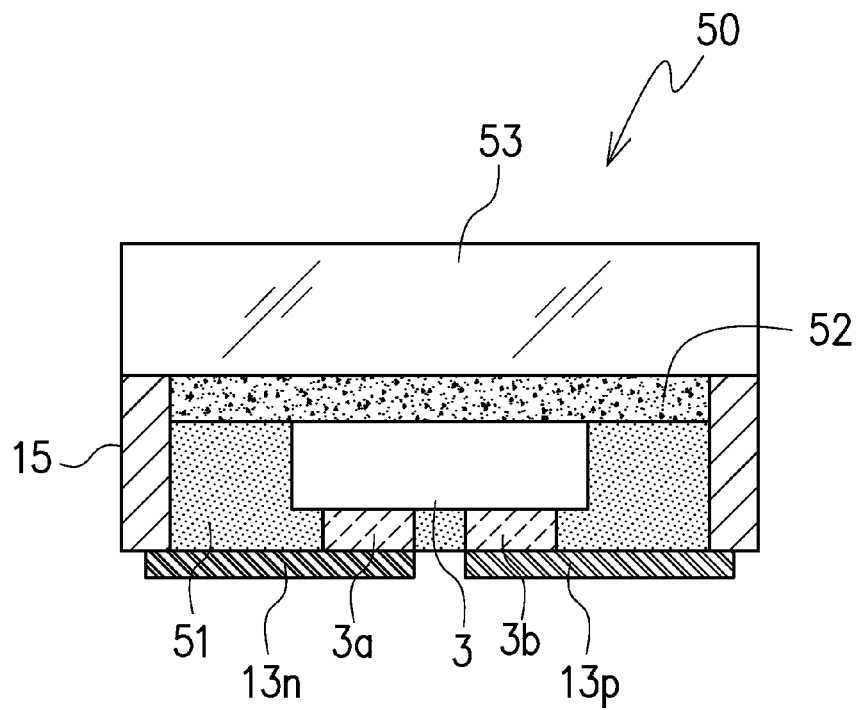
FIG. 36 is a cross-sectional view of a light-emitting device according to a fifth embodiment of the invention.

FIG. 36 shows a light-emitting device produced by a production method according to a fifth embodiment of the present invention. FIGS. 37 and 38 show steps of the production method according to the fifth embodiment.

A light-emitting device 50 of the present embodiment includes: a light-emitting element 3 including an upper surface, a lower surface, a peripheral surface extending between the upper and lower surfaces, and element electrodes in a pair formed on the lower surface; a phosphor layer 52 being a fluorescent agent-containing resin layer provided on the upper surface of the light-emitting element 3; a transparent base 53 provided on the upper surface of the phosphor layer 52; a sealing member 51 arranged so as to expose the element electrodes in a pair of the light-emitting element 3, the sealing member 51 sealing the peripheral side surface of the light-emitting element 3; and external connection electrodes 13n and 13p in a pair electrically connected to the element electrodes 3a and 3b in a pair of the light-emitting element 3 and provided on the sealing member 51. The light-emitting device 50 is characterized in that the phosphor layer 52 is provided to the upper surface of the light-emitting element 3 with a peripheral side surface sealed with the sealing member 51 made of a transparent resin, and that the transparent base 53 being a glass base and the like is stacked over the upper surface of the phosphor layer 52. The peripheral side surface of the sealing member 51 is surrounded by a reflection frame 15, and the external connection electrodes 13n and 13p are formed on the lower surface of the sealing member 51 and on the lower surfaces of the element electrodes 3a and 3b of the light-emitting element 3. In the present embodiment, the element electrodes 3a and 3b are made of gold bumps, and the external connection electrodes 13n and 13p have the same three layer structure as that of the external connection electrodes of the light-emitting device 10 of the first embodiment.

The method of producing the light-emitting device 50 will next be described based on FIGS. 37 and 38. In the production method according to the present embodiment, a large number of light-emitting elements are placed on a large-sized glass base to form light-emitting devices 50 in mass production at one time. Meanwhile, for simplification of the description, two light-emitting devices are shown as an example in the drawings.

Figure 37A:
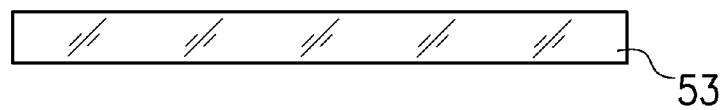
FIG. 37 includes process diagrams showing the former part of a method of producing the light-emitting device shown in FIG. 36.
Figure 37B:
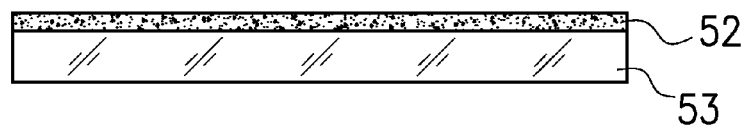
Figure 37C:
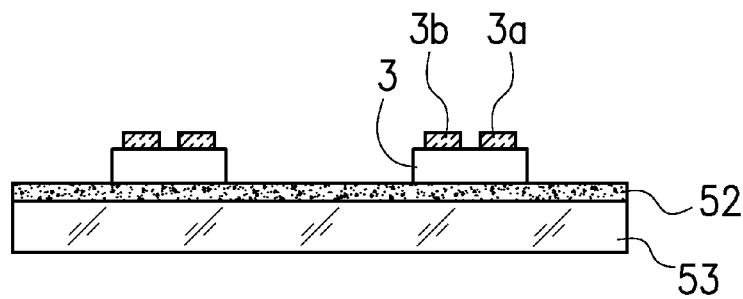
Figure 37D:
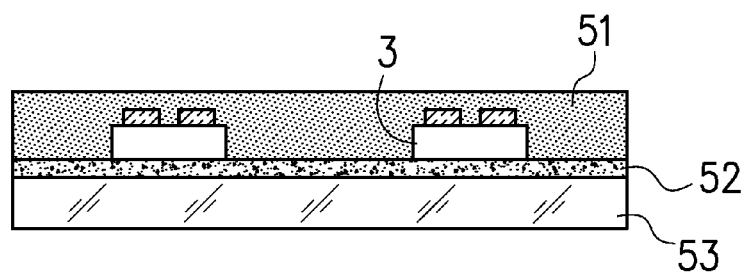

First, as shown in FIGS. 37A and B, the transparent base 53 of a thickness of about some hundreds of micrometers is prepared first, and then the phosphor layer 52 is formed on the upper surface of the transparent base 53. The phosphor layer 52 is formed by mixing a fluorescent agent into a silicone resin or an epoxy resin functioning as a binder, and is formed to a thickness of about 100 µm. Next, as shown in FIG. 37C, a plurality of light-emitting elements 3 is arranged on the upper surface of the phosphor layer 52 while the element electrodes 3a and 3b turn upward. Then, as shown in FIG. 37D, the light-emitting elements 3 arranged on the transparent base 53 are sealed with the sealing member 51. The sealing member 51 is made of a silicone resin. Alternatively, the sealing member 51 may be made of a material that is vitrified by being sintered such as organo polysiloxane. The element electrodes 3a and 3b of the light-emitting elements 3 are composed of gold bumps and the like that preferably project to a height of from about 10 µm to about 30 µm.

Figure 38E:
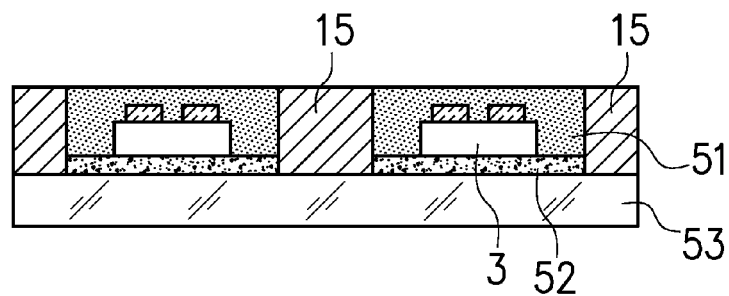
FIG. 38 includes process diagrams showing the latter part of the method of producing the light-emitting device shown in FIG. 36.
Figure 38F:
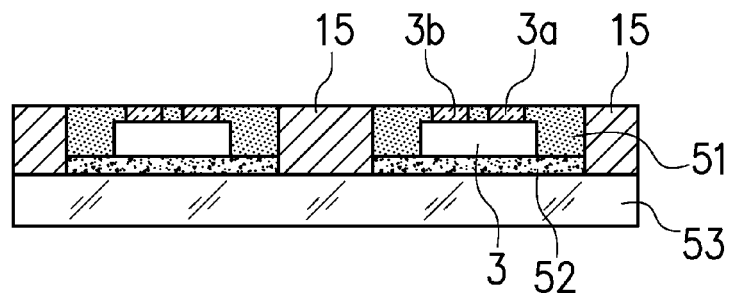
Figure 38G:
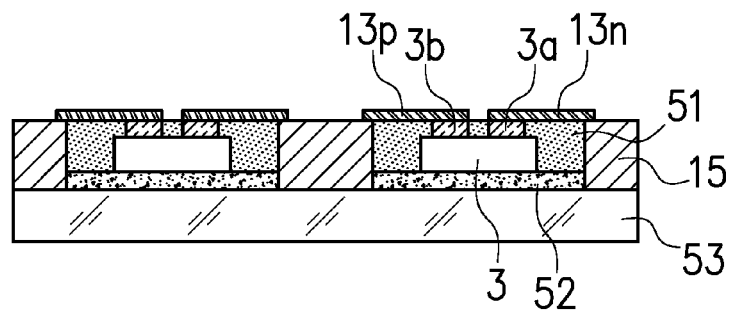
Figure 38H:
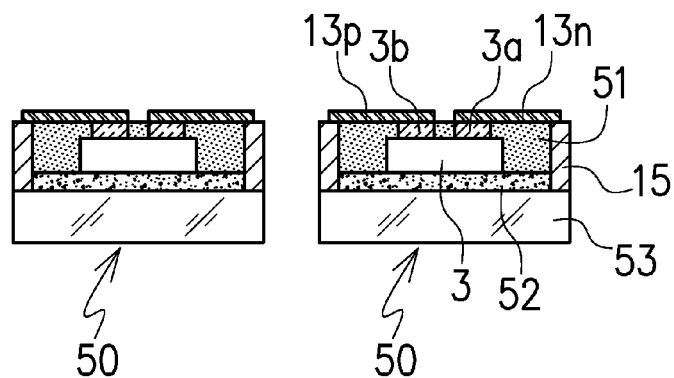

Next, vertical slots are formed in the sealing member 51, and a white paste is poured into the vertical slots and then cured, thereby forming the reflection frame 15 shown in FIG. 38E. The sealing member 51 and the reflection frame 15 are thereafter grined until the lower surfaces of the element electrodes 3a and 3b appear to form a flat surface as shown in FIG. 38F. Further, as shown in FIG. 38G, the external connection electrodes 13n and 13p are formed in the same way as that of the first embodiment on the lower surfaces of the element electrodes 3a and 3b of the light-emitting elements 3 and the lower surface of the sealing member 51. Like in the embodiments described above, the external connection electrodes 13n and 13p each have a three layer structure with a base electrode film, a nickel layer, and a gold layer. After the external connection electrodes 13n and 13p are formed, as shown in FIG. 38H, the reflection frame 15 is cut along its center line to form the light-emitting devices 50 individually, thereby completing the light-emitting devices 50.

The light-emitting device 50 of the fifth embodiment includes the transparent base 53 being a glass base and the like provided above the light-emitting element 3, thereby increasing the rigidity of the entire device. Further, the phosphor layer 52 is covered with a glass base including low permeability to gas, thereby increasing the reliability of the entire device and prolonging the product life of the device.

(Sixth Embodiment)

Figure 39:
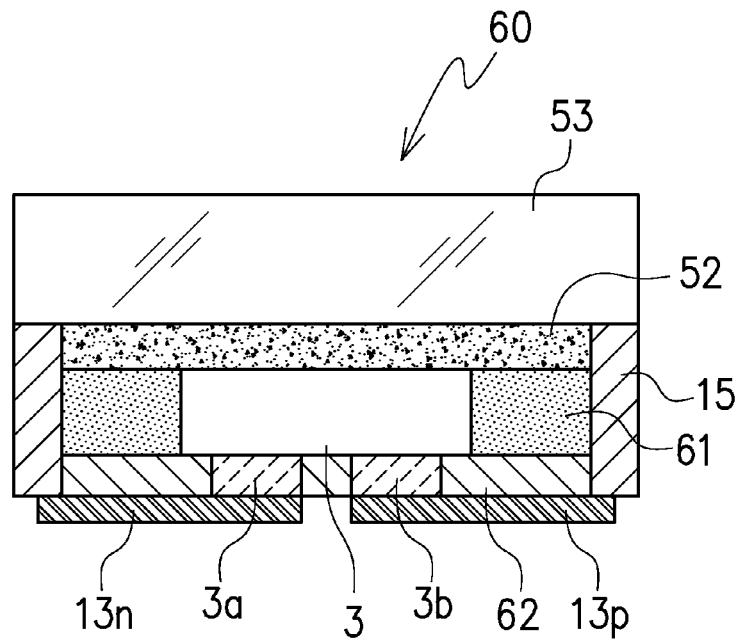
FIG. 39 is a cross-sectional view of a light-emitting device according to a sixth embodiment of the invention.

FIG. 39 shows a light-emitting device 60 of a sixth embodiment of the invention. The light-emitting device 60 includes: a light-emitting element 3 including an upper surface, a lower surface, a peripheral side surface extending between the upper and lower surfaces, and element electrodes in a pair formed on the lower surface; a phosphor layer 52 being a fluorescent agent-containing resin layer provided on the upper surface of the light-emitting element 3; a transparent base 53 being a glass base and the like provided on the upper surface of the phosphor layer 52; a sealing member arranged so as to expose the element electrodes 3a and 3b in a pair of the light-emitting element 3, the sealing member sealing the peripheral side surface of the light-emitting element 3; and external connection electrodes 13n and 13p in a pair electrically connected to the element electrodes 3a and 3b in a pair of the light-emitting element 3 and provided on the sealing member. The light-emitting device 60 is different from the light-emitting device 50 according to the above-described fifth embodiment in that the sealing member sealing the light-emitting element 3 is composed of a transparent resin layer 61 and a white reflection layer 62 in a two layer structure. The transparent resin layer 61 is provided so as to cover the outer peripheral side surface of the light-emitting element 3. The white reflection layer 62 is provided around the element electrodes 3a and 3b in a pair formed on the lower surface of the light-emitting element 3 to seal the element electrodes. Like the corresponding one in the light-emitting device 30 of the third embodiment, the white reflection layer 62 seals the element electrodes 3a and 3b of the light-emitting element 3 with a white ceramic ink. However, the material of the white reflection layer 62 is not limited to an inorganic material such as white ceramic ink, but may be a silicone resin or an epoxy resin containing reflective fine powder such as that of titanium oxide. The other structures of the light-emitting device 60 are the same as those of the light-emitting device 50 of the fifth embodiment, and therefore, they are denoted by the same reference numbers and will not be described in detail.

Figure 40A:
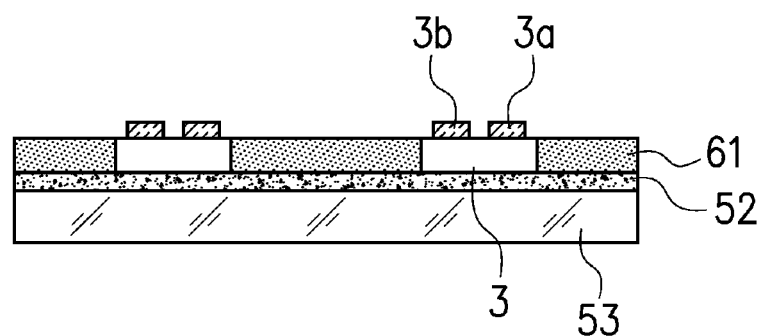
FIG. 40 includes process diagrams showing characteristic part of a method of producing the light-emitting device shown in FIG. 39.
Figure 40B:
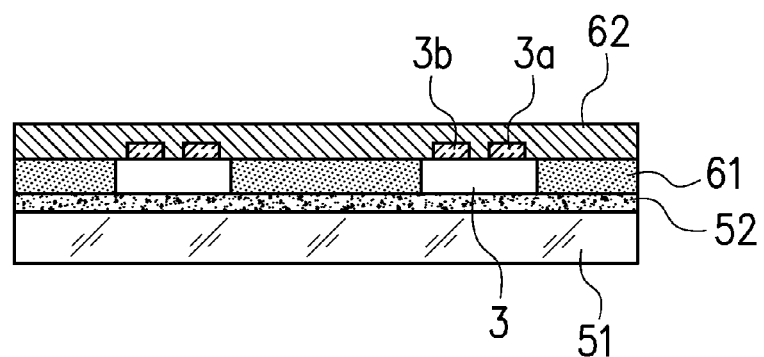
Figure 41:
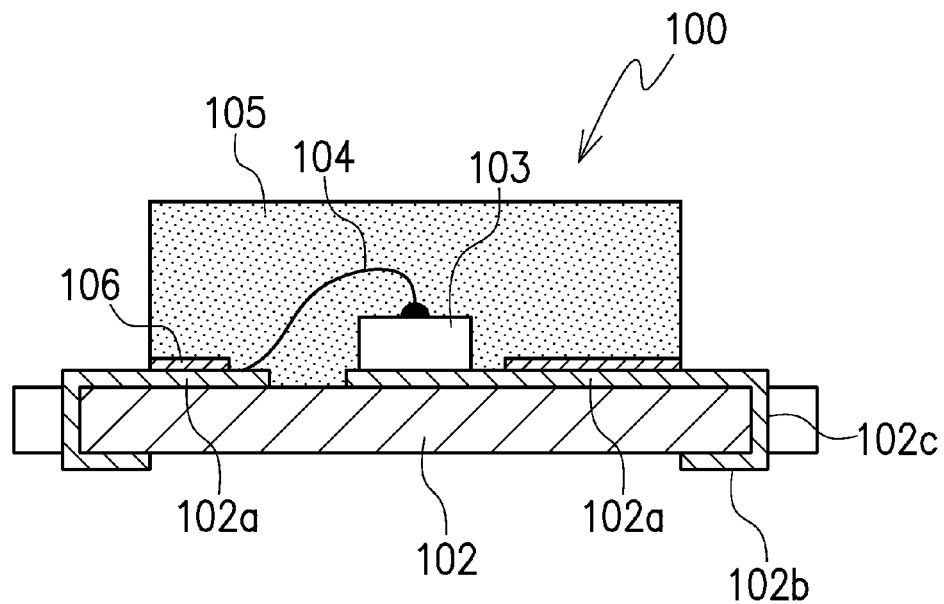
FIG. 41 is a cross-sectional view showing an example of a conventional light-emitting device.
Figure 42:
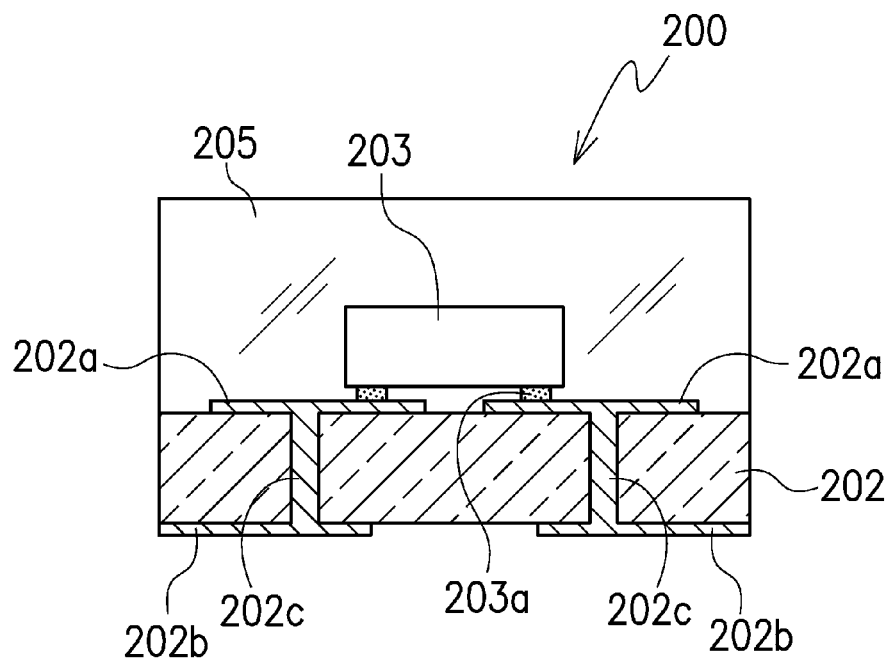
FIG. 42 is a cross-sectional view showing a different example of a conventional light-emitting device.
Figure 43:
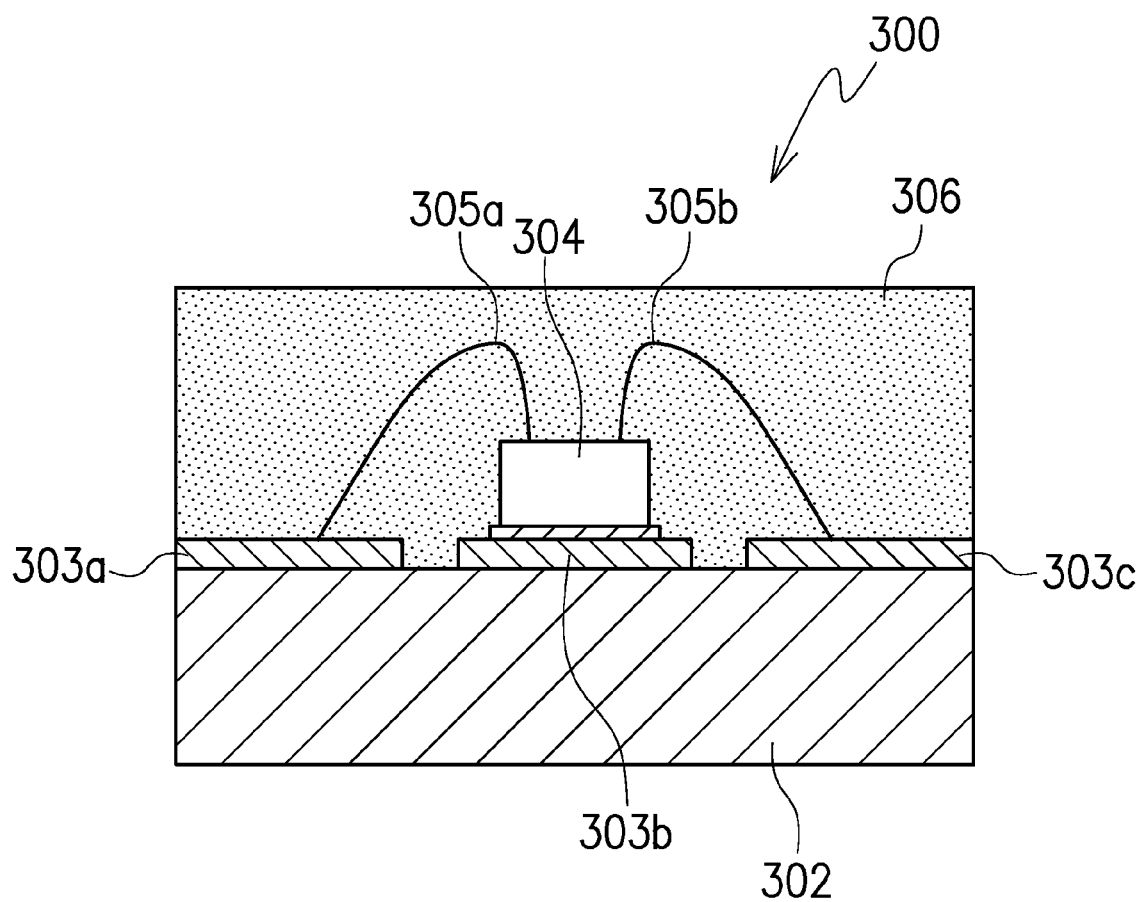
FIG. 43 is a cross-sectional view showing an example of a conventional light-emitting device from which a substrate to hold a light-emitting element thereon is removed.

A method of producing the light-emitting device of the sixth embodiment includes the same steps up to forming the phosphor layer 52 on the upper surface of the transparent base 53 and arranging the light-emitting elements 3 on the phosphor layer 52 in the method of producing the light-emitting device of the previously described fifth embodiment. In the step of sealing the light-emitting elements 3 with the transparent resin layer 61, the transparent resin layer 61 is formed only to a height that exposes the element electrodes 3a and 3b of the light-emitting elements 3 as shown in FIG. 40A. Then, the transparent resin layer 61 is cured temporally. The white reflection layer 62 is thereafter applied to a height above the element electrodes 3a and 3b as shown in FIG. 40B and then cured together with the transparent resin layer 61. After the curing, the white reflection layer 62 is grined to expose the lower surfaces of the element electrodes 3a and 3b of the light-emitting elements 3. The formation means of a reflection frame 15 and the external connection electrodes 13n and 13p can be performed by following the same steps as those of the fifth embodiment, and therefore, the formation thereof will not be described again.

In the light-emitting devices of the first to sixth embodiments, the element electrodes 3a and 3b of the light-emitting element 3 are composed of projecting electrodes with projecting portions such as gold bumps. However, the element electrodes 3a and 3b are not limited to such projecting electrodes. For example, the element electrodes may be an n electrode and a p electrode (cathode and anode) formed in a semiconductor layer of a light-emitting element, and external connection electrodes may be directly connected to the n and p electrodes.

Reference Signs List
- 3 light-emitting element
- 3a N electrode (element electrode)
- 3b P electrode (element electrode)
- 3L sealing member collectively resin-sealing the plurality of light-emitting elements
- 5 sealing member
- 5a lower surface
- 6, 26 base electrode film
- 6a, 26a N electrode base film
- 6b, 26b P electrode base film
- 6c, 6d, 26c, 26d exposed base electrode film
- 8 cutting portion
- 10, 20, 30, 40, 50, 60 light-emitting device
- 11a, 11b, 21a, 21b nickel layer
- 12a, 12b, 22a, 22b gold layer
- 13n, 23n N external connection electrode
- 13P, 23p P external connection electrode
- 15 reflection frame
- 25 protection film
- 27a, 27b step portion
- 31 first sealing member
- 32 second sealing member
- 51 sealing member
- 52 phosphor layer
- 53 transparent base
- 61 transparent resin layer
- 62 white reflection layer
- 63, 83 first resist mask
- 64, 84 second resist mask
- 70 external substrate
- 71, 72 interconnection electrode
- 80 jig plate
- 81 adhesive sheet
- 81a adhesive glue layer
- 81b base layer

The invention claimed is:

1. A method of producing a light-emitting device, comprising:
    preparing a detachable adhesive sheet;
    preparing a plurality of light-emitting elements each including element electrodes in a pair;
    arranging the plurality of light-emitting elements with the element electrodes in a pair of each of the light-emitting elements in contact with the adhesive sheet and buried in an adhesive layer of the adhesive sheet;
    providing a sealing member on the adhesive sheet at a side on which the plurality of light-emitting elements are arranged and sealing the plurality of light-emitting elements with the sealing member; and
    stripping the adhesive sheet from the element electrodes in contact with the adhesive sheet to expose the element electrodes of the plurality of light-emitting elements.

2. The method of producing a light-emitting device according to claim 1, comprising:
    providing a reflection member on the sealing member at a side on which the element electrodes of the plurality of light-emitting elements are exposed.

3. The method of producing a light-emitting device according to claim 2, comprising exposing at least one surface of each of the element electrodes in a pair of each of the plurality of light-emitting elements from the reflection member by grinding the reflection member.

4. The method of producing a light-emitting device according to claim 3, comprising forming external connection electrodes in a pair that are in contact with at least portions of the element electrodes in a pair of each light-emitting element and exposed from the reflection member and configured to be electrically connected to the element electrodes in a pair of each of the light-emitting elements.

5. The method of producing a light-emitting device according to claim 1, comprising forming external connection electrodes in a pair that are in contact with at least portions of the element electrodes in a pair of each light-emitting element and configured to be electrically connected to the element electrodes of each of the light-emitting elements.

6. The method of producing a light-emitting device according to claim 1, comprising:
    when the sealing member is provided and the plurality of light-emitting elements are sealed with the sealing member, providing a reflection frame including a plurality of rectangular grids each of that surrounds each of the light-emitting elements, and sealing each of the light-emitting elements in one rectangular grid of the reflection frame including the plurality of rectangular grids; and
    dividing the sealing member by cutting along the reflection frame.

7. The method of producing a light-emitting device according to claim 1, comprising:
    when the sealing member is provided and the plurality of light-emitting elements are sealed with the sealing member, half-dicing the sealing member vertically and horizontally to form a slot having a shape of a rectangular grid around each of the light-emitting elements, and forming a reflection frame in the slot, and
    dividing the sealing member by cutting along the reflection frame.

8. A method of producing a light-emitting device, comprising:
    Preparing a plurality of light emitting elements each including element electrodes in a pair;
    arranging the plurality of light-emitting elements with the element electrodes in a pair of each of the plurality of light-emitting elements exposed from a sealing member;
    before a base electrode film is formed on the element electrodes of each of the plurality of light-emitting elements that are sealed with the sealing member, forming a protection film at a position corresponding to a position where the base electrode film is to be formed on the sealing member and on portions of the element electrodes except surfaces of the element electrodes exposed from the sealing member;
    forming the base electrode film on the element electrodes of each of the plurality of light-emitting elements;
    forming a resist mask on the base electrode film at a position where the base electrode film is divided into portions corresponding to a P electrode and an N electrode that are the element electrodes in a pair;

forming metal plating for external connection electrode on the base electrode film at a position where the resist mask is not formed;

removing the resist mask; and forming external connection electrodes in a plurality of pairs by etching the base electrode film at a position where the resist mark has been removed by using the metal plating for external connection electrode as a mask, the external connection electrodes in each pair being electrically divided into a P electrode and an N electrode and formed at positions where the external connection electrodes are electrically connected to the element electrodes in a pair of each of the plurality of light-emitting elements.

* * * * *